United States Patent
Odnoblyudov et al.

(10) Patent No.: US 10,181,419 B2
(45) Date of Patent: Jan. 15, 2019

(54) VERTICAL SEMICONDUCTOR DIODE MANUFACTURED WITH AN ENGINEERED SUBSTRATE

(71) Applicant: Qromis, Inc., Santa Clara, CA (US)

(72) Inventors: Vladimir Odnoblyudov, Danville, CA (US); Dilip Risbud, San Jose, CA (US); Ozgur Aktas, Pleasanton, CA (US); Cem Basceri, Los Gatos, CA (US)

(73) Assignee: QROMIS, INC., Santa Clara, CA (US)

( * ) Notice: Subject to any disclaimer, the term of this patent is extended or adjusted under 35 U.S.C. 154(b) by 0 days.

(21) Appl. No.: 15/684,753

(22) Filed: Aug. 23, 2017

(65) Prior Publication Data
US 2018/0061630 A1 Mar. 1, 2018

Related U.S. Application Data

(60) Provisional application No. 62/378,382, filed on Aug. 23, 2016.

(51) Int. Cl.
*H01L 21/683* (2006.01)
*H01L 21/02* (2006.01)
(Continued)

(52) U.S. Cl.
CPC ........ *H01L 21/6835* (2013.01); *C30B 25/183* (2013.01); *C30B 29/06* (2013.01); *C30B 29/406* (2013.01); *H01L 21/0242* (2013.01); *H01L 21/0254* (2013.01); *H01L 21/0257* (2013.01); *H01L 21/02428* (2013.01); *H01L 21/02458* (2013.01); *H01L 21/28264* (2013.01); *H01L 21/4807* (2013.01); *H01L 21/762* (2013.01); *H01L 29/1033* (2013.01); *H01L 29/2003* (2013.01); *H01L 29/205* (2013.01);
(Continued)

(58) Field of Classification Search
CPC ............ H01L 21/6835; H01L 29/4236; H01L 29/7786; H01L 21/762; H01L 29/66462; H01L 29/42376; H01L 29/205; H01L 21/28264; H01L 21/4807; H01L 29/8613; C30B 29/406; C30B 25/183; C30B 29/06
See application file for complete search history.

(56) References Cited

U.S. PATENT DOCUMENTS

2008/0142923 A1* 6/2008 Tischler .............. H01L 21/764
257/531
2017/0179307 A1* 6/2017 Dang ...................... H01J 1/30

* cited by examiner

*Primary Examiner* — Bilkis Jahan
(74) *Attorney, Agent, or Firm* — Kilpatrick Townsend & Stockton LLP

(57) ABSTRACT

A semiconductor diode includes an engineered substrate including a substantially single crystal layer, a buffer layer coupled to the substantially single crystal layer, and a semi-insulating layer coupled to the buffer layer. The semiconductor diode also includes a first N-type gallium nitride layer coupled to the semi-insulating layer and a second N-type gallium nitride layer coupled to the first N-type gallium nitride layer. The first N-type gallium nitride layer has a first doping concentration and the second N-type gallium nitride layer has a second doping concentration less than the first doping concentration. The semiconductor diode further includes a P-type gallium nitride layer coupled to the second N-type gallium nitride layer, an anode contact coupled to the P-type gallium nitride layer, and a cathode contact coupled to a portion of the first N-type gallium nitride layer.

7 Claims, 20 Drawing Sheets

(51) Int. Cl.
*H01L 21/28* (2006.01)
*H01L 21/48* (2006.01)
*H01L 29/10* (2006.01)
*H01L 29/20* (2006.01)
*H01L 29/205* (2006.01)
*H01L 29/417* (2006.01)
*H01L 29/423* (2006.01)
*H01L 29/66* (2006.01)
*H01L 29/778* (2006.01)
*H01L 29/861* (2006.01)
*C30B 25/18* (2006.01)
*C30B 29/06* (2006.01)
*C30B 29/40* (2006.01)
*H01L 29/872* (2006.01)
*H01L 21/762* (2006.01)
*H01L 29/40* (2006.01)

(52) U.S. Cl.
CPC ...... *H01L 29/4175* (2013.01); *H01L 29/4236* (2013.01); *H01L 29/42376* (2013.01); *H01L 29/66143* (2013.01); *H01L 29/66204* (2013.01); *H01L 29/66462* (2013.01); *H01L 29/7786* (2013.01); *H01L 29/7787* (2013.01); *H01L 29/861* (2013.01); *H01L 29/8613* (2013.01); *H01L 29/872* (2013.01); *H01L 29/1066* (2013.01); *H01L 29/402* (2013.01); *H01L 2221/6835* (2013.01); *H01L 2221/68345* (2013.01)

VERTICAL SEMICONDUCTOR DIODE MANUFACTURED WITH AN ENGINEERED SUBSTRATE

CROSS-REFERENCES TO RELATED APPLICATIONS

This application claims priority to U.S. Provisional Patent Application No. 62/378,382, filed on Aug. 23, 2016, the disclosure of which is hereby incorporated by reference in its entirety for all purposes.

The following regular U.S. patent applications (including this one) are being filed concurrently, and the entire disclosure of the other application is incorporated by reference into this application for all purposes:

application Ser. No. 15/684,724, filed Aug. 23, 2017, entitled "ELECTRONIC POWER DEVICES INTEGRATED WITH AN ENGINEERED SUBSTRATE" ; and application Ser. No. 15/684,753, filed Aug. 23, 2017, entitled "VERTICAL SEMICONDUCTOR DIODE MANUFACTURED WITH AN ENGINEERED SUBSTRATE" .

BACKGROUND OF THE INVENTION

Gallium nitride based power devices are typically epitaxially grown on sapphire substrates. The growth of gallium nitride based power devices on a sapphire substrate is a heteroepitaxial growth process since the substrate and the epitaxial layers are composed of different materials. Due to the heteroepitaxial growth process, the epitaxially grown material can exhibit a variety of adverse effects, including reduced uniformity and reductions in metrics associated with the electronic/optical properties of the epitaxial layers. Accordingly, there is a need in the art for improved methods and systems related to epitaxial growth processes and substrate structures.

SUMMARY OF THE INVENTION

The present invention relates generally to power devices formed on engineered substrate structures. More specifically, the present invention relates to methods and systems suitable for fabricating power devices using epitaxial growth processes. As described herein, some embodiments of the present invention have been applied to methods and systems for fabricating power devices and semiconductor diodes on a substrate structure by epitaxial growth, wherein the substrate structure is characterized by a coefficient of thermal expansion (CTE) that is substantially matched to epitaxial layers that form the power devices. The methods and techniques can be applied to a variety of semiconductor processing operations.

According to an embodiment of the present invention, a power device is provided. The power device includes a substrate comprising a polycrystalline ceramic core, a first adhesion layer coupled to the polycrystalline ceramic core, a barrier layer coupled to the first adhesion layer, a bonding layer coupled to the barrier layer, and a substantially single crystal layer coupled to the bonding layer. The power device also includes a buffer layer coupled to the substantially single crystal layer and a channel region coupled to the buffer layer. The channel region includes a first end, a second end, and a central portion disposed between the first end and the second end. The channel region also includes a channel region barrier layer coupled to the buffer layer. The power device further includes a source contact disposed at the first end of the channel region, a drain contact disposed at the second end of the channel region, and a gate contact coupled to the channel region.

According to another embodiment of the present invention, a method of forming a power device is provided. The method includes forming a substrate by providing a polycrystalline ceramic core, encapsulating the polycrystalline ceramic core with a first adhesion shell, encapsulating the first adhesion shell with a barrier layer, forming a bonding layer on the barrier layer, and joining a substantially single crystal layer to the bonding layer. The method also includes forming a buffer layer on the substantially single crystal layer and forming a channel region on the buffer layer by forming an epitaxial channel region barrier layer on the buffer layer. The channel region has a first end and a second end, and a central portion between the first end and the second end. The method also includes forming a source contact at the first end of the channel region, forming a drain contact at the second end of the channel region, and forming a gate contact on the channel region.

According to a particular embodiment of the present invention, a semiconductor diode is provided. The semiconductor diode includes a substrate including a polycrystalline ceramic core, a first adhesion layer coupled to the polycrystalline ceramic core, a barrier layer coupled to the first adhesion layer, a bonding layer coupled to the barrier layer, and a substantially single crystal layer coupled to the bonding layer. The semiconductor diode also includes a buffer layer coupled to the substantially single crystal layer, a semi-insulating layer coupled to the buffer layer, and a first N-type gallium nitride layer coupled to the semi-insulating layer. The first N-type gallium nitride layer has a first doping concentration. The semiconductor diode further includes a second N-type gallium nitride layer coupled to the first N-type gallium nitride layer. The second N-type gallium nitride layer has a second doping concentration less than the first doping concentration. Moreover, the semiconductor diode includes a P-type gallium nitride layer coupled to the second N-type gallium nitride layer, an anode contact coupled to the P-type gallium nitride layer, and a cathode contact coupled to a portion of the first N-type gallium nitride layer.

According to another particular embodiment of the present invention, a method of forming a semiconductor diode is provided. The method includes forming a substrate by providing a polycrystalline ceramic core, encapsulating the polycrystalline ceramic core with a first adhesion shell, encapsulating the first adhesion shell with a barrier layer, forming a bonding layer on the barrier layer, and joining a substantially single crystal layer to the bonding layer. The method also includes forming a buffer layer on the substantially single crystal layer, forming a semi-insulating layer on the buffer layer, and forming a first epitaxial N-type gallium nitride layer on the semi-insulating layer. The first epitaxial N-type gallium nitride layer has a first doping concentration. The method further includes forming a second epitaxial N-type gallium nitride layer on the first epitaxial N-type gallium nitride layer. The second epitaxial N-type gallium nitride layer has a second doping concentration less than the first doping concentration. Additionally, the method includes forming an epitaxial P-type gallium nitride layer on the second epitaxial N-type gallium nitride layer, removing a portion of the second epitaxial N-type gallium nitride layer and a portion of the epitaxial P-type gallium nitride layer to expose a portion of the first epitaxial N-type gallium nitride layer, forming an anode contact on a remaining portion of the epitaxial P-type gallium nitride layer, and forming a cathode contact on the exposed portion of the first epitaxial N-type gallium nitride layer.

According to a specific embodiment of the present invention, a method of forming a semiconductor diode is provided. The method includes forming a substrate by providing a polycrystalline ceramic core, encapsulating the polycrystalline ceramic core with a first adhesion shell, encapsulating the first adhesion shell with a barrier layer, forming a bonding layer on the barrier layer, and joining a substantially single crystal layer to the bonding layer. The method also includes forming a first epitaxial N-type gallium nitride layer on the substantially single crystal layer and forming a second epitaxial N-type gallium nitride layer on the first epitaxial N-type gallium nitride layer. The first epitaxial N-type gallium nitride layer has a first doping concentration and the second epitaxial N-type gallium nitride layer has a second doping concentration less than the first doping concentration. The method further includes forming an epitaxial P-type gallium nitride layer on the second epitaxial N-type gallium nitride layer, removing a portion of the substrate to expose a surface of the first epitaxial N-type gallium nitride layer, forming an anode contact on the epitaxial P-type gallium nitride layer, and forming a cathode contact on the exposed surface of the first epitaxial N-type gallium nitride layer.

According to another specific embodiment of the present invention, a power device is provided. The power device includes a substrate comprising a polycrystalline ceramic core, a first adhesion layer coupled to the polycrystalline ceramic core, a barrier layer coupled to the first adhesion layer, a bonding layer coupled to the barrier layer, and a substantially single crystal layer coupled to the bonding layer. The power device also includes a buffer layer coupled to the substantially single crystal layer and a channel region coupled to the buffer layer. The channel region comprises a first end, a second end, and a central portion disposed between the first end and the second end. The channel region includes a channel region barrier layer coupled to the buffer layer and a source contact disposed at the first end of the channel region. The device further includes a drain contact disposed at the second end of the channel region and a gate contact coupled to the channel region. As an example, the buffer layer can include at least one of a III-V semiconductor material, silicon germanium, aluminum gallium nitride, indium gallium nitride, or indium aluminum gallium nitride.

Numerous benefits are achieved by way of the present invention over conventional techniques. For example, embodiments of the present invention provide power devices and semiconductor diodes formed on engineered substrates that have a coefficient of thermal expansion (CTE) that is substantially matched to the CTE of the epitaxial layers of the devices. Matching the thermal expansion properties of the growth substrate to the epitaxial layer reduces the stress in the epitaxial layers and/or the engineered substrate. Stress is responsible for several types of defects. For example, stress may increase dislocation density in the epitaxial layer, which impairs electrical and optical properties of the epitaxial layer. Stress may also lead to residual strain in the epitaxial layer or the substrate, which may lead to additional processing concern in later steps, such as stress cracking, dislocation glide, slip, bow and warp. Thermal expansion induced bow and warp of the substrate may make handling of the material problematic in automated equipment, and limit the ability to perform additional lithographic steps necessary for device fabrication, substrate cracking, and materials creep. In addition, the device performance lifetime is reduced in stressed materials. Stress relaxation and stress-induced crack propagation, dislocation glide, and other lattice movement resulting from thermal mismatch may lead to early failures in a range of modes, from reduced device performance to fracture or peeling of devices and device layers.

These and other embodiments of the invention along with many of its advantages and features are described in more detail in conjunction with the text below and attached figures.

DETAILED DESCRIPTION OF SPECIFIC EMBODIMENTS

The present invention relates generally to power devices formed on engineered substrate structures. More specifically, the present invention relates to methods and systems suitable for fabricating power devices using epitaxial growth processes. Merely by way of example, the invention has been applied to a method and system for fabricating power devices on a substrate structure by epitaxial growth, wherein the substrate structure is characterized by a coefficient of thermal expansion (CTE) that is substantially matched to epitaxial layers that form the power devices. The methods and techniques can be applied to a variety of semiconductor processing operations.

Figure 1:
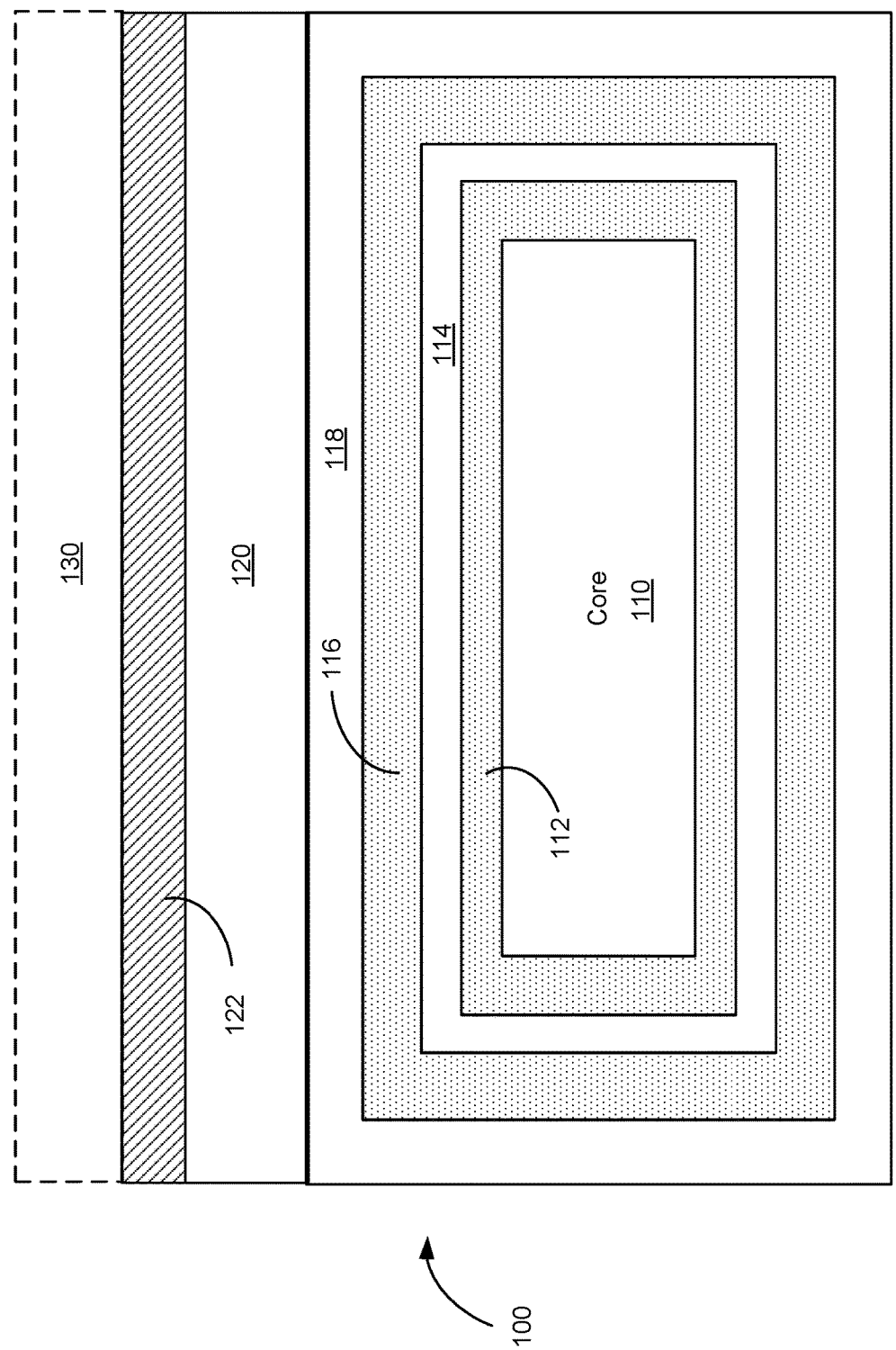
FIG. 1 is a simplified schematic cross-sectional diagram illustrating an engineered substrate structure according to an embodiment of the present invention.

FIG. 1 is a simplified schematic cross-sectional diagram illustrating an engineered substrate structure according to an embodiment of the present invention. The engineered substrate 100 illustrated in FIG. 1 is suitable for a variety of electronic and optical applications. The engineered substrate 100 includes a core 110 that can have a coefficient of thermal expansion (CTE) that is substantially matched to the CTE of the epitaxial material that will be grown on the engineered substrate 100. Epitaxial material 130 is illustrated as optional because it is not required as an element of the engineered substrate 100, but will typically be grown on the engineered substrate 100.

For applications including the growth of gallium nitride (GaN)-based materials (epitaxial layers including GaN-based layers), the core 110 can be a polycrystalline ceramic material, for example, polycrystalline aluminum nitride (AlN), which can include a binding material such as yttrium oxide. Other materials can be utilized in the core 110, including polycrystalline gallium nitride (GaN), polycrystalline aluminum gallium nitride (AlGaN), polycrystalline silicon carbide (SiC), polycrystalline zinc oxide (ZnO), polycrystalline gallium trioxide ($Ga_2O_3$), and the like.

The thickness of the core can be on the order of 100 to 1,500 μm, for example, 725 μm. The core 110 is encapsulated in an adhesion layer 112 that can be referred to as a shell or an encapsulating shell. In an embodiment, the adhesion layer 112 comprises a tetraethyl orthosilicate (TEOS) oxide layer on the order of 1,000 Å in thickness. In other embodiments, the thickness of the adhesion layer varies, for example, from 100 Å to 2,000 Å. Although TEOS oxides are utilized for adhesion layers in some embodiments, other materials that provide for adhesion between later deposited layers and underlying layers or materials (e.g., ceramics, in particular, polycrystalline ceramics) can be utilized according to an embodiment of the present invention. For example, $SiO_2$ or other silicon oxides ($Si_xO_y$) adhere well to ceramic materials and provide a suitable surface for subsequent deposition, for example, of conductive materials. In some embodiments, the adhesion layer 112 completely surrounds the core 110 to form a fully encapsulated core. The adhesion layer 112 can be formed using an LPCVD process. The adhesion layer provides a surface on which subsequent layers adhere to form elements of the engineered substrate 100 structure.

In addition to the use of LPCVD processes, furnace-based processes, and the like to form the encapsulating first adhesion layer, other semiconductor processes can be utilized according to embodiments of the present invention, including CVD processes or similar deposition processes. As an example, a deposition process that coats a portion of the core can be utilized, the core can be flipped over, and the deposition process could be repeated to coat additional portions of the core. Thus, although LPCVD techniques are utilized in some embodiments to provide a fully encapsulated structure, other film formation techniques can be utilized depending on the particular application.

A conductive layer 114 is formed surrounding the adhesion layer 112. In an embodiment, the conductive layer 114 is a shell of polysilicon (i.e., polycrystalline silicon) that is formed surrounding the first adhesion layer 112 since polysilicon can exhibit poor adhesion to ceramic materials. In embodiments in which the conductive layer 114 is polysilicon, the thickness of the polysilicon layer can be on the order of 500-5,000 Å, for example, 2,500 Å. In some embodiments, the polysilicon layer can be formed as a shell to completely surround the first adhesion layer 112 (e.g., a TEOS oxide layer), thereby forming a fully encapsulated first adhesion layer, and can be formed using an LPCVD process. In other embodiments, as discussed below, the conductive material can be formed on a portion of the adhesion layer, for example, a lower half of the substrate structure. In some embodiments, conductive material can be formed as a fully encapsulating layer and subsequently removed on one side of the substrate structure.

In an embodiment, the conductive layer 114 can be a polysilicon layer doped to provide a highly conductive material, for example, doped with boron to provide a P-type polysilicon layer. In some embodiments, the doping with boron is at a level of $1\times10^{19}$ $cm^{-3}$ to $1\times10^{20}$ $cm^{-3}$ to provide for high conductivity. Other dopants at different dopant concentrations (e.g., phosphorus, arsenic, bismuth, or the like at dopant concentrations ranging from $1\times10^{16}$ $cm^{-3}$ to $5\times10^{18}$ $cm^3$) can be utilized to provide either N-type or P-type semiconductor materials suitable for use in the conductive layer 114. One of ordinary skill in the art would recognize many variations, modifications, and alternatives.

The presence of the conductive layer 114 is useful during electrostatic chucking of the engineered substrate 100 to semiconductor processing tools, for example tools with electrostatic discharge (ESD) chucks. The conductive layer 114 enables rapid dechucking after processing in the semiconductor processing tools. Thus, embodiments of the present invention provide substrate structures that can be processed in manners utilized with conventional silicon wafers. One of ordinary skill in the art would recognize many variations, modifications, and alternatives.

A second adhesion layer 116 (e.g., a TEOS oxide layer on the order of 1,000 Å in thickness) is formed surrounding the conductive layer 114. In some embodiments, the second adhesion layer 116 completely surrounds the conductive layer 114 to form a fully encapsulated structure. The second adhesion layer 116 can be formed using an LPCVD process, a CVD process, or any other suitable deposition process, including the deposition of a spin-on dielectric.

A barrier layer 118, for example, a silicon nitride layer, is formed surrounding the second adhesion layer 116. In an embodiment, the barrier layer is a silicon nitride layer 118 that is on the order of 4,000 Å to 5,000 Å in thickness. The barrier layer 118 completely surrounds the second adhesion layer 116 in some embodiments to form a fully encapsulated structure and can be formed using an LPCVD process. In addition to silicon nitride layers, amorphous materials including SiCN, SiON, AlN, SiC, and the like can be utilized as barrier layers. In some implementations, the barrier layer consists of a number of sub-layers that are built up to form the barrier layer. Thus, the term barrier layer is not intended to denote a single layer or a single material, but to encompass one or more materials layered in a composite manner. One of ordinary skill in the art would recognize many variations, modifications, and alternatives.

In some embodiments, the barrier layer, e.g., a silicon nitride layer, prevents diffusion and/or outgassing of elements present in the core 110 into the environment of the semiconductor processing chambers in which the engineered substrate 100 could be present, for example, during a high temperature (e.g., 1,000° C.) epitaxial growth process. Elements present in the core 110 can include, for example, yttrium oxide (i.e., yttria), oxygen, metallic impurities, other trace elements, and the like. The elements diffused from the core 110 can cause unintentional doping in engineered layers 120/122. The elements outgassed from the core 110 can travel through the chamber and adsorb elsewhere on the wafer causing impurities in engineered layers 120/122 and epitaxial material 130. Utilizing the encapsulating layers described herein, ceramic materials, including polycrystalline AlN that are designed for non-clean room environments, can be utilized in semiconductor process flows and clean room environments.

Figure 2A:
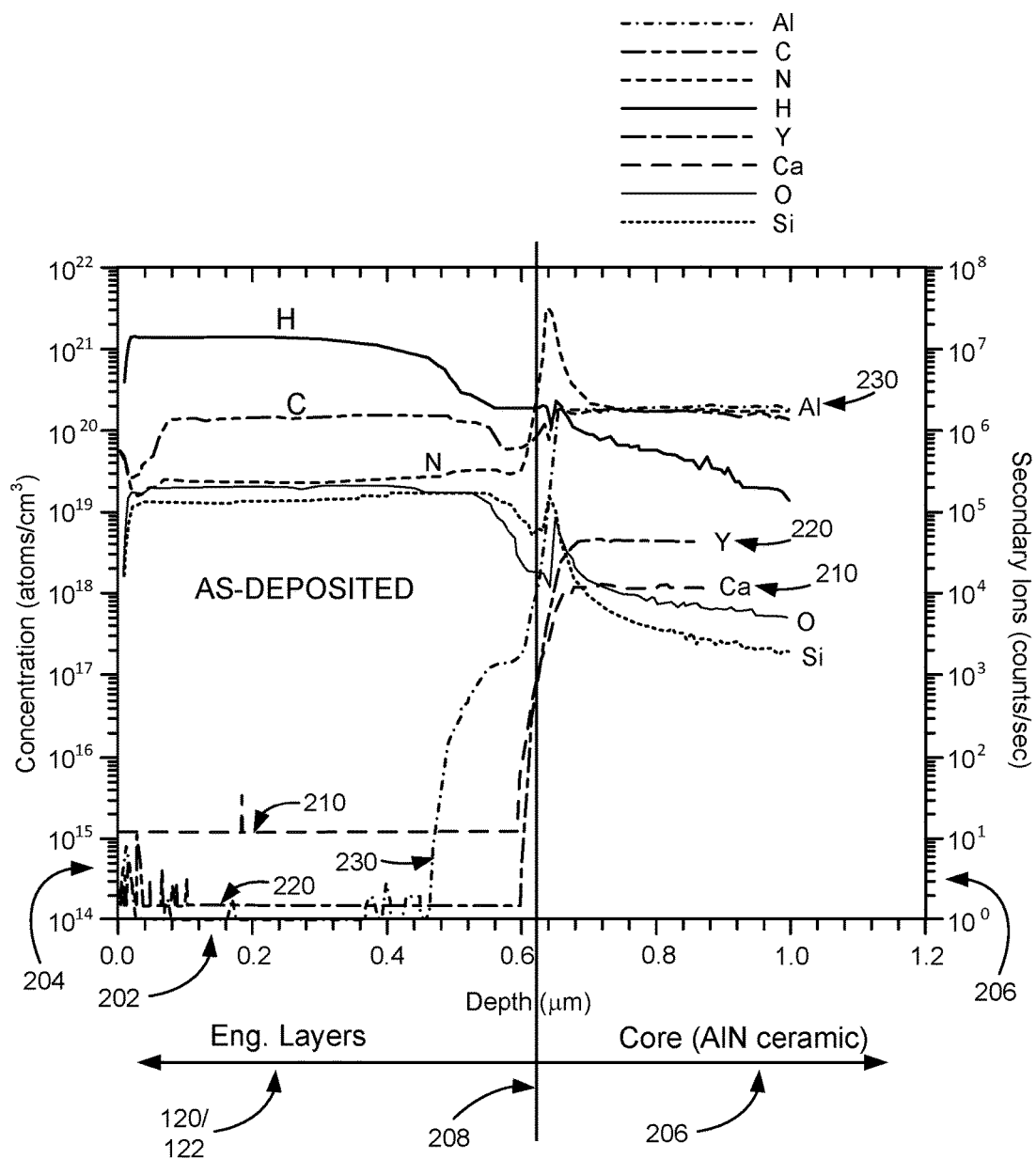
FIG. 2A is a SIMS profile illustrating species concentration as a function of depth for an engineered structure according to an embodiment of the present invention.

FIG. 2A is a secondary ion mass spectroscopy (SIMS) profile illustrating species concentration as a function of depth for an engineered structure according to an embodiment of the present invention. The x-axis represents the depth 202 from the surface of the engineered layers 120/122 to the core 110. Line 208 represents the interface between the engineered layers 120/122 and the core 110. A first y-axis represents the species concentration of atoms per cubic centimeter 204. A second y-axis represents the signal intensity of the ions in counts per second 206. The engineered structure in FIG. 2A did not include barrier layer 118. Referring to FIG. 2A, several species present in the ceramic core 110 (e.g., yttrium, calcium, and aluminum) drop to negligible concentrations in the engineered layers 120/122. The concentrations of calcium 210, yttrium 220, and aluminum 230 drop by three, four, and six orders of magnitude, respectively.

Figure 2B:
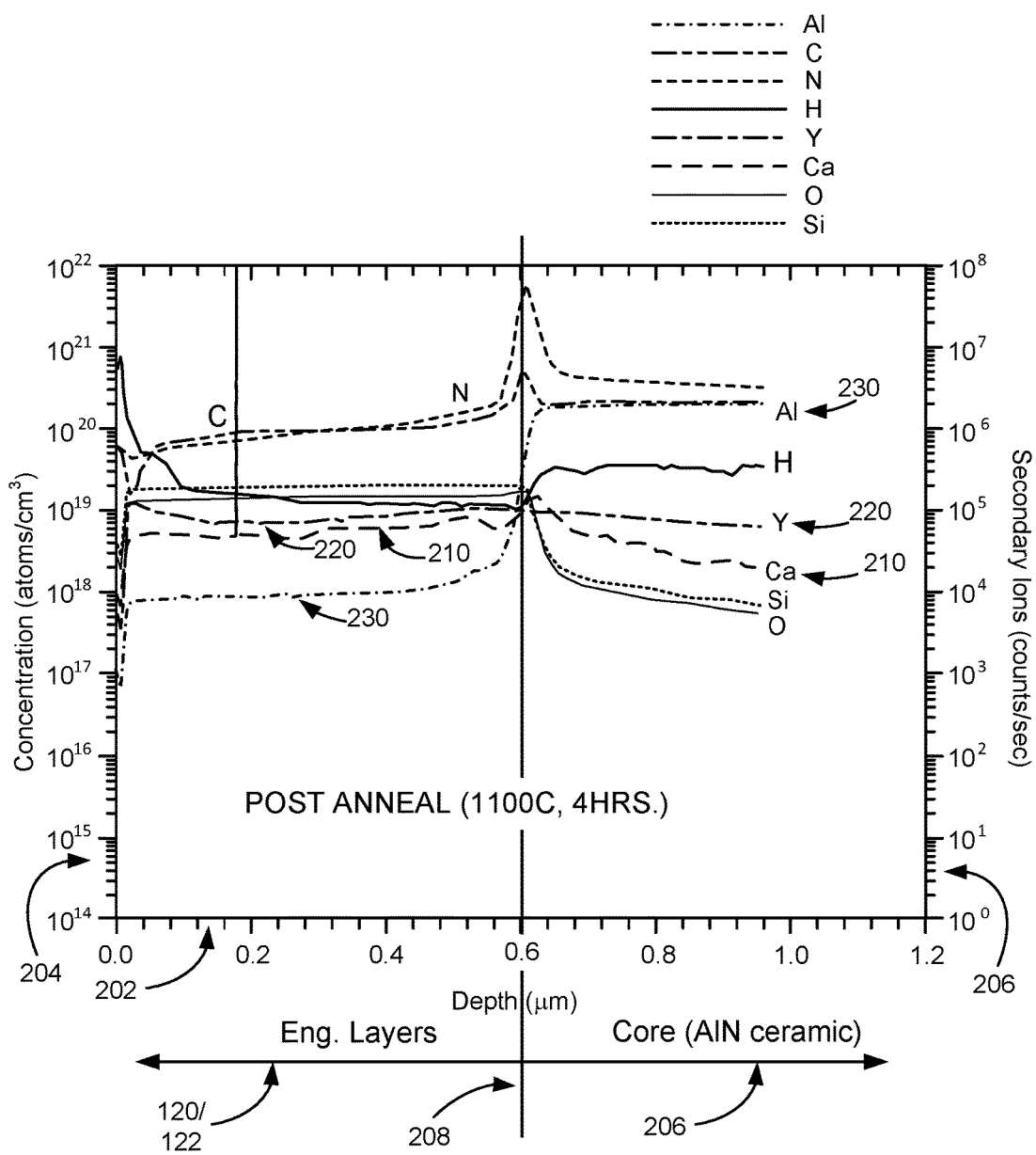
FIG. 2B is a SIMS profile illustrating species concentration as a function of depth for an engineered structure after anneal according to an embodiment of the present invention.

FIG. 2B is a SIMS profile illustrating species concentration as a function of depth for an engineered structure without a barrier layer after anneal according to an embodiment of the present invention. As discussed above, during semiconductor processing operations, the engineered substrate structures provided by embodiments of the present invention can be exposed to high temperatures (~1,100° C.) for several hours, for example, during epitaxial growth of GaN-based layers. For the profile illustrated in FIG. 2B, the engineered substrate structure was annealed at 1,100° C. for a period of four hours. As shown by FIG. 2B, calcium 210, yttrium 220, and aluminum 230, originally present in low concentrations in the engineered layers 120/122, have diffused into the engineered layers 120/122, reaching concentrations similar to other elements.

Accordingly, embodiments of the present invention integrate a barrier layer (e.g., a silicon nitride layer) to prevent out-diffusion of the background elements from the polycrystalline ceramic material (e.g., AlN) into the engineered layers 120/122 and epitaxial material 130 such as the optional GaN layer. The silicon nitride layer encapsulating the underlying layers and material provides the desired barrier layer 118 functionality.

Figure 2C:
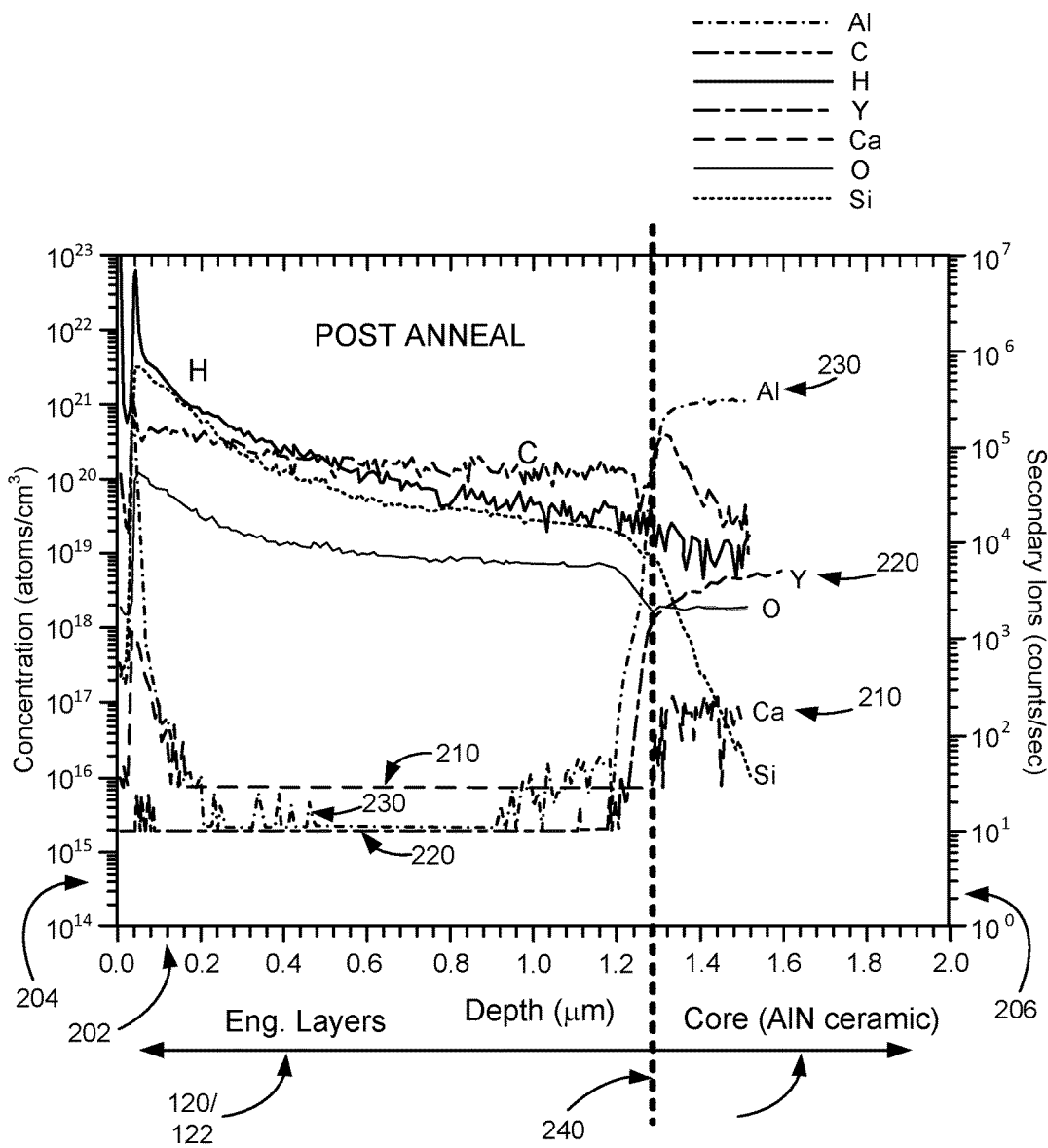
FIG. 2C is a SIMS profile illustrating species concentration as a function of depth for an engineered structure with a silicon nitride layer after anneal according to an embodiment of the present invention.

FIG. 2C is a SIMS profile illustrating species concentration as a function of depth for an engineered structure with a barrier layer 118, represented by dashed-line 240, after anneal according to an embodiment of the present invention. The integration of the diffusion barrier layer 118 (e.g., a silicon nitride layer) into the engineered substrate structure prevents the diffusion of calcium, yttrium, and aluminum into the engineered layers during the annealing process that occurred when the diffusion barrier layer was not present. As illustrated in FIG. 2C, calcium 210, yttrium 220, and aluminum 230 present in the ceramic core remain at low concentrations in the engineered layers post-anneal. Thus, the use of the barrier layer 118 (e.g., a silicon nitride layer) prevents these elements from diffusing through the diffusion barrier and thereby prevents their release into the environment surrounding the engineered substrate. Similarly, any other impurities contained within the bulk ceramic material would be contained by the barrier layer.

Typically, ceramic materials utilized to form the core 110 are fired at temperatures in the range of 1,800° C. It would be expected that this process would drive out a significant amount of impurities present in the ceramic materials. These impurities can include yttrium, which results from the use of yttria as sintering agent, calcium, and other elements and compounds. Subsequently, during epitaxial growth processes, which are conducted at much lower temperatures in the range of 800° C. to 1,100° C., it would be expected that the subsequent diffusion of these impurities would be insignificant. However, contrary to conventional expectations, the inventors have determined that even during epitaxial growth processes at temperatures much less than the firing temperature of the ceramic materials, significant diffusion of elements through the layers of the engineered substrate was present. Thus, embodiments of the present invention integrate the barrier layer 118 into the engineered substrate 100 to prevent this undesirable diffusion.

Referring once again to FIG. 1, a bonding layer 120 (e.g., a silicon oxide layer) is deposited on a portion of the barrier layer 118, for example, the top surface of the barrier layer, and subsequently used during the bonding of a single crystal layer 122. The bonding layer 120 can be approximately 1.5 µm in thickness in some embodiments. The single crystal layer 122 can include, for example, Si, SiC, sapphire, GaN, AlN, SiGe, Ge, Diamond, $Ga_2O_3$, AlGaN, InGaN, InN, and/or ZnO. In some embodiments, the single crystal layer can have a thickness from 0-0.5 µm. The single crystal layer 122 is suitable for use as a growth layer during an epitaxial growth process for the formation of epitaxial material 130. The crystalline layers of the epitaxial material 130 are an extension of the underlying semiconductor lattice associated with the single crystal layer 122. The unique CTE matching properties of the engineered substrate 100 enable growth of thicker epitaxial material 130 than existing technologies. In some embodiments, the epitaxial material 130 includes a gallium nitride layer, 2 µm to 10 µm in thickness, which can be utilized as one of a plurality of layers utilized in optoelectronic devices, power devices, and the like. In an embodiment, the bonding layer 120 includes a single crystal silicon layer that is attached to a silicon oxide barrier layer 118 using a layer transfer process.

Figure 3:
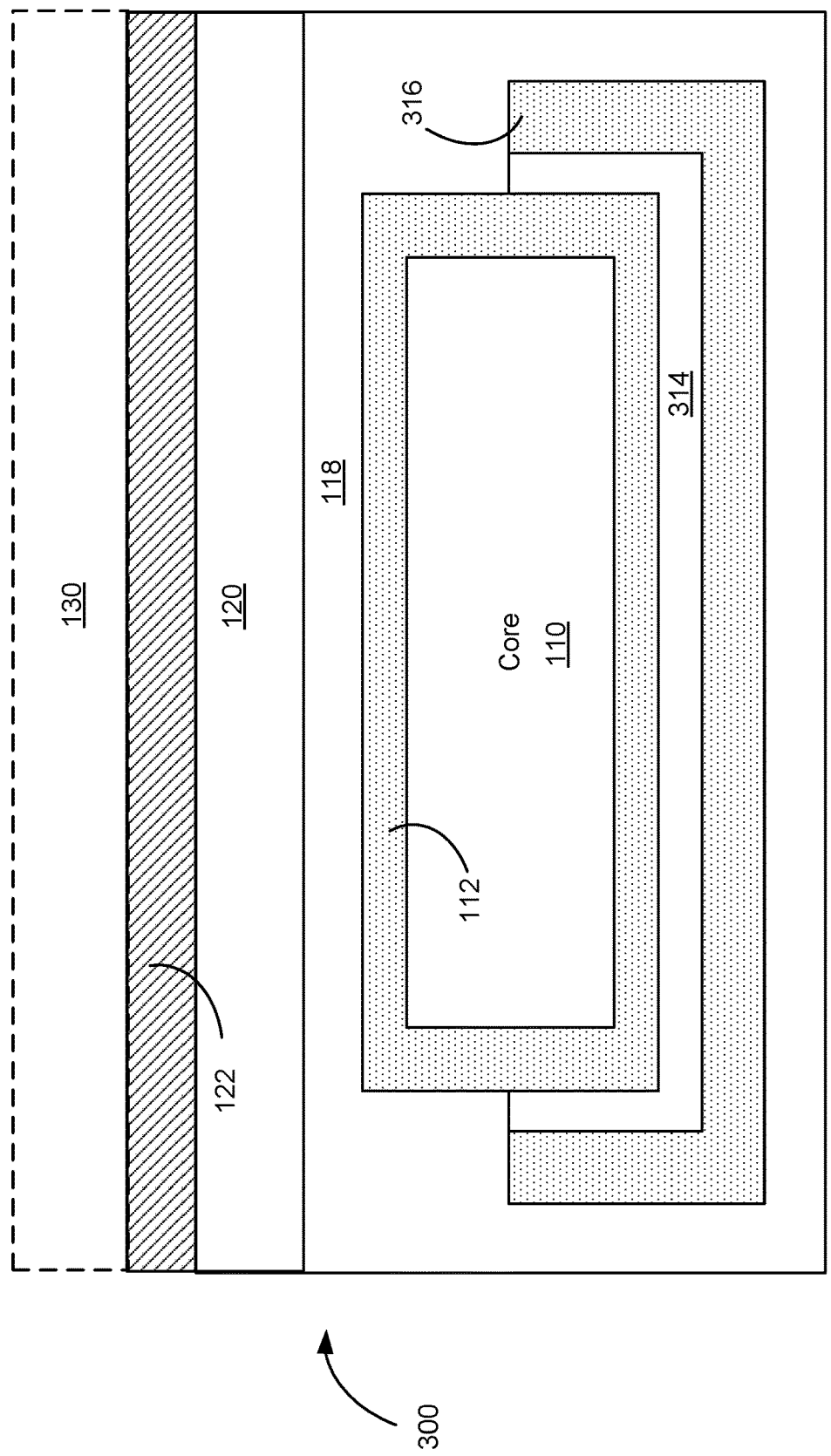
FIG. 3 is a simplified schematic cross-sectional diagram illustrating an engineered substrate structure according to another embodiment of the present invention.

FIG. 3 is a simplified schematic cross-sectional diagram illustrating an engineered substrate structure according to an embodiment of the present invention. The engineered substrate 300 illustrated in FIG. 3 is suitable for a variety of electronic and optical applications. The engineered substrate 300 includes a core 110 that can have a coefficient of thermal expansion (CTE) that is substantially matched to the CTE of the epitaxial material that will be grown on the engineered substrate 300. Epitaxial material 130 is illustrated as optional because it is not required as an element of the engineered substrate structure, but will typically be grown on the engineered substrate structure.

For applications including the growth of gallium nitride (GaN)-based materials (epitaxial layers including GaN-based layers), the core 110 can be a polycrystalline ceramic material, for example, polycrystalline aluminum nitride (AlN). The thickness of the core can be on the order of 100 µm to 1,500 µm, for example, 725 µm. The core 110 is encapsulated in an adhesion layer 112 that can be referred to as a shell or an encapsulating shell. In this implementation, the adhesion layer 112 completely encapsulates the core, but this is not required by the present invention, as discussed in additional detail with respect to FIG. 4.

In an embodiment, the adhesion layer 112 comprises a tetraethyl orthosilicate (TEOS) oxide layer on the order of 1,000 Å in thickness. In other embodiments, the thickness of the adhesion layer varies, for example, from 100 Å to 2,000 Å. Although TEOS oxides are utilized for adhesion layers in some embodiments, other materials that provide for adhesion between later deposited layers and underlying layers or materials can be utilized according to an embodiment of the present invention. For example, $SiO_2$, SiON, and the like adhere well to ceramic materials and provide a suitable surface for subsequent deposition of, for example, conductive materials. The adhesion layer 112 completely surrounds the core 110 in some embodiments to form a fully encapsulated core and can be formed using an LPCVD process. The adhesion layer 112 provides a surface on which subsequent layers adhere to form elements of the engineered substrate structure.

In addition to the use of LPCVD processes, furnace-based processes, and the like to form the encapsulating adhesion layer 112, other semiconductor processes can be utilized according to embodiments of the present invention. As an example, a deposition process, for example, CVD, PECVD, or the like, that coats a portion of the core 110 can be utilized, the core 110 can be flipped over, and the deposition process could be repeated to coat additional portions of the core 110.

A conductive layer 314 is formed on at least a portion of the adhesion layer 112. In an embodiment, the conductive layer 314 includes polysilicon (i.e., polycrystalline silicon) that is formed by a deposition process on a lower portion (e.g., the lower half or backside) of the structure formed by the core 110 and the adhesion layer 112. In embodiments in which the conductive layer 314 is polysilicon, the thickness of the polysilicon layer can be on the order of a few thousand angstroms, for example, 3,000 Å. In some embodiments, the polysilicon layer can be formed using an LPCVD process.

In an embodiment, the conductive layer 314 can be a polysilicon layer doped to provide a highly conductive material, for example, the conductive layer 314 can be doped with boron to provide a P-type polysilicon layer. In some embodiments, the doping with boron is at a level ranging from about $1 \times 10^{19}$ cm$^{-3}$ to $1 \times 10^{20}$ cm$^{-3}$ to provide for high conductivity. The presence of the conductive layer 314 is useful during electrostatic chucking of the engineered substrate to semiconductor processing tools, for example tools with electrostatic discharge (ESD) chucks. The conductive layer 314 enables rapid dechucking after processing. Thus, embodiments of the present invention provide substrate structures that can be processed in manners utilized with conventional silicon wafers. One of ordinary skill in the art would recognize many variations, modifications, and alternatives.

A second adhesion layer 316 (e.g., a second TEOS oxide layer) is formed surrounding the conductive layer 314 (e.g., a polysilicon layer). The second adhesion layer 316 is on the order of 1,000 Å in thickness. The second adhesion layer 316 completely surrounds the conductive layer 114 in some embodiments to form a fully encapsulated structure and can be formed using an LPCVD process.

A barrier layer 118 (e.g., a silicon nitride layer) is formed surrounding the second adhesion layer 316. The barrier layer 118 is on the order of 4,000 Å to 5,000 Å in thickness in some embodiments. The barrier layer 118 completely surrounds the second adhesion layer 112 in some embodiments to form a fully encapsulated structure and can be formed using an LPCVD process.

In some embodiments, the use of a barrier layer 118 that includes silicon nitride prevents diffusion and/or outgassing of elements present in the core 110 into the environment of the semiconductor processing chambers in which the engineered substrate could be present, for example, during a high temperature (e.g., 1,000° C.) epitaxial growth process. Elements present in the core include, for example, yttrium oxide (i.e., yttria), oxygen, metallic impurities, other trace elements and the like. Utilizing the encapsulating layers described herein, ceramic materials, including polycrystalline AlN, that are designed for non-clean room environments can be utilized in semiconductor process flows and clean room environments.

In some embodiments, the engineered substrate 100 can be compliant with Semiconductor Equipment and Materials International (SEMI) standard specifications. Because the engineered substrate 100 can be compliant with SEMI specifications, the engineered substrate 100 can be used with existing semiconductor fabrication tools. For example, wafer diameter for the engineered substrate can be 4-inch, 6-inch, or 8-inch. In some embodiments, an 8-inch engineered substrate wafer can be 725-750 µm in thickness. In contrast, current silicon substrates used to manufacture gallium nitride epitaxial layers are not compliant with SEMI specifications because the silicon substrates are 1050-1500 µm in thickness. As a result of the non-compliance, silicon substrates cannot be used in equipment that complies with SEMI specifications.

Figure 4:
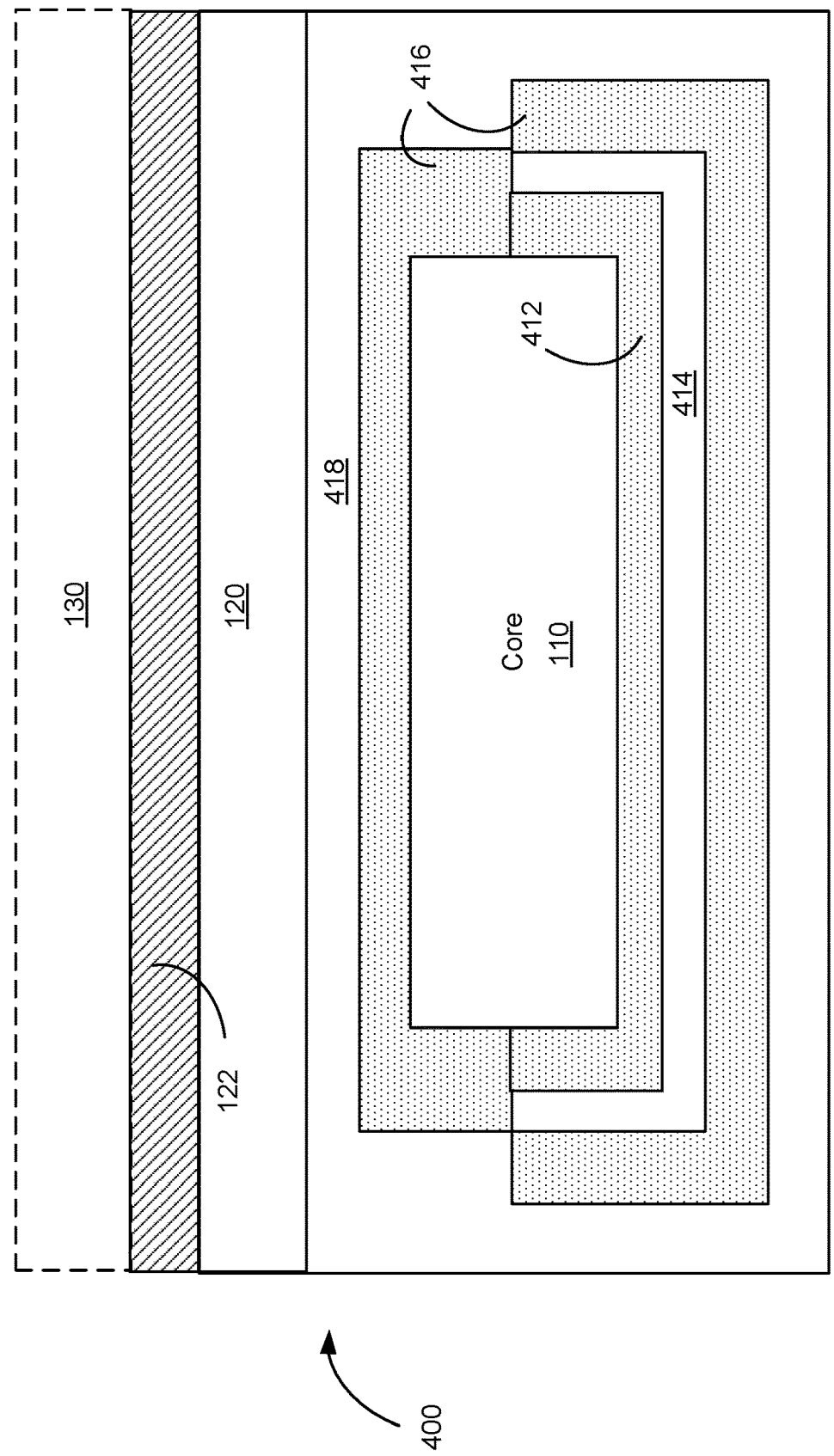
FIG. 4 is a simplified schematic cross-sectional diagram illustrating an engineered substrate structure according to yet another embodiment of the present invention.

FIG. 4 is a simplified schematic cross-sectional diagram illustrating an engineered substrate structure 400 according to another embodiment of the present invention. In the embodiment illustrated in FIG. 4, the adhesion layer 412 is formed on at least a portion of the core 110 but does not encapsulate the core 110. In this implementation, the adhesion layer 412 is formed on a lower surface of the core (the backside of the core) in order to enhance the adhesion of a subsequently formed conductive layer 414 as described more fully below. Although adhesion layer 412 is only illustrated on the lower surface of the core in FIG. 4, it will be appreciated that deposition of adhesion layer material on other portions of the core will not adversely affect the performance of the engineered substrates structure and such material can be present in various embodiments. One of ordinary skill in the art would recognize many variations, modifications, and alternatives.

The conductive layer 414, rather than being formed as a shell as illustrated in FIG. 3, does not encapsulate the adhesion layer 412 and core 110, but is substantially aligned with the adhesion layer 412. Although the conductive layer 414 is illustrated as extending along the bottom or backside and up a portion of the sides of the adhesion layer 412, this is not required by the present invention. Thus, embodiments can utilize deposition on one side of the substrate structure, masking of one side of the substrate structure, or the like. The conductive layer 414 can be formed on a portion of one side, for example, the bottom/backside, of the adhesion layer 412. The conductive layer 414 provides for electrical conduction on one side of the engineered substrate structure 400, which can be advantageous in RF and high power applications. The conductive layer 414 can include doped polysilicon as discussed in relation to conductive layer 114 in FIG. 1. In addition to semiconductor-based conductive layers, in other embodiments, the conductive layer 414 is a metallic layer, for example, 500 Å of titanium, or the like.

Portions of the core 110, portions of the adhesion layer 412, and the conductive layer 414 are covered with a second adhesion layer 416 in order to enhance the adhesion of the barrier layer 418 to the underlying materials. The barrier layer 418 forms an encapsulating structure to prevent diffusion from underlying layers as discussed above in relation to FIGS. 2A, 2B, and 2C.

Referring once again to FIG. 4, depending on the implementation, one or more layers may be removed. For example, layers 412 and 414 can be removed, leaving only single adhesion shell 416 and barrier layer 418. In another embodiment, only layer 414 can be removed, leaving single adhesion layer 412 underneath the barrier layer 416. In this embodiment, adhesion layer 412 may also balance the stress and the wafer bow induced by bonding layer 120, deposited on top of barrier layer 418. The construction of a substrate structure with insulating layers on the top side of core 110 (e.g., with only insulating layer between core 110 and bonding layer 120) will provide benefits for power/RF applications, where a highly insulating substrate is desirable.

In another embodiment, barrier layer 418 may directly encapsulate core 110, followed by conductive layer 414 and subsequent adhesion layer 416. In this embodiment, bonding layer 120 may be directly deposited onto adhesion layer 416 from the top side. In yet another embodiment, adhesion layer 416 may be deposited on core 110, followed by a barrier layer 418, and then followed by conductive layer 414, and another adhesion layer 412.

Although some embodiments have been discussed in terms of a layer, the term layer should be understood such that a layer can include a number of sub-layers that are built up to form the layer of interest. Thus, the term layer is not intended to denote a single layer consisting of a single material, but to encompass one or more materials layered in a composite manner to form the desired structure. One of ordinary skill in the art would recognize many variations, modifications, and alternatives.

Figure 5:
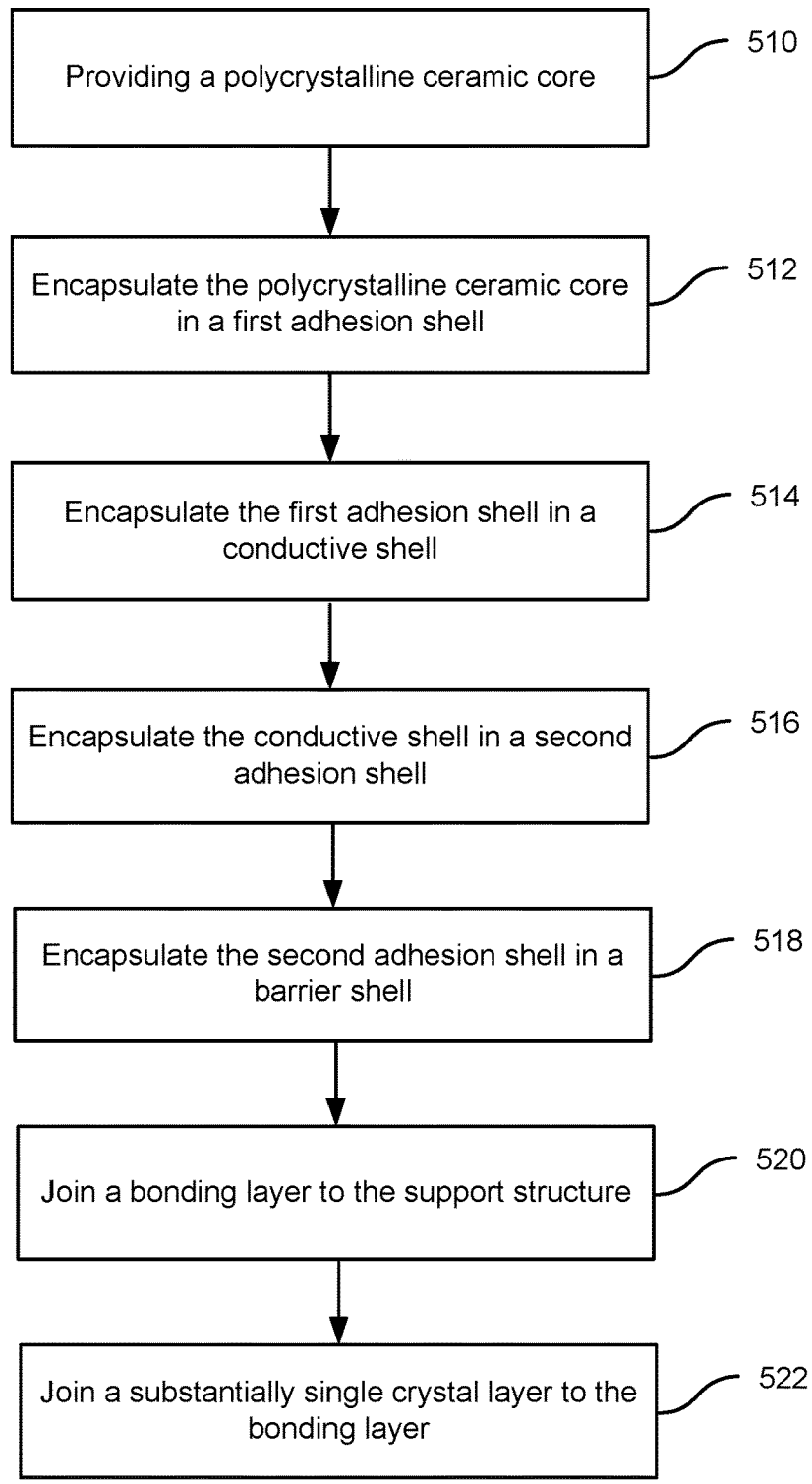
FIG. 5 is a simplified flowchart illustrating a method of fabricating an engineered substrate according to an embodiment of the present invention.

FIG. 5 is a simplified flowchart illustrating a method of fabricating an engineered substrate according to an embodiment of the present invention. The method can be utilized to manufacture a substrate that is CTE matched to one or more of the epitaxial layers grown on the substrate. The method 500 includes forming a support structure by providing a polycrystalline ceramic core (510), encapsulating the polycrystalline ceramic core in a first adhesion layer forming a shell (512) (e.g., a tetraethyl orthosilicate (TEOS) oxide shell), and encapsulating the first adhesion layer in a conductive shell (514) (e.g., a polysilicon shell). The first adhesion layer can be formed as a single layer of TEOS oxide. The conductive shell can be formed as a single layer of polysilicon.

The method also includes encapsulating the conductive shell in a second adhesion layer (516) (e.g., a second TEOS oxide shell) and encapsulating the second adhesion layer in a barrier layer shell (518). The second adhesion layer can be formed as a single layer of TEOS oxide. The barrier layer shell can be formed as a single layer of silicon nitride.

Once the support structure is formed by processes 510-518, the method further includes joining a bonding layer (e.g., a silicon oxide layer) to the support structure (520) and joining a substantially single crystal layer, for example, a single crystal silicon layer, to the silicon oxide layer (522). Other substantially single crystal layers can be used according to embodiments of the present invention, including SiC, sapphire, GaN, AlN, SiGe, Ge, Diamond, $Ga_2O_3$, ZnO, and the like. The joining of the bonding layer can include deposition of a bonding material followed by planarization processes as described herein. In an embodiment as described below, joining the substantially single crystal layer (e.g., a single crystal silicon layer) to the bonding layer utilizes a layer transfer process in which the layer is a single crystal silicon layer that is transferred from a silicon wafer.

Referring to FIG. 1, the bonding layer 120 can be formed by a deposition of a thick (e.g., 4 µm thick) oxide layer followed by a chemical mechanical polishing (CMP) process to thin the oxide to approximately 1.5 µm in thickness. The thick initial oxide serves to fill voids and surface features present on the support structure that may be present after fabrication of the polycrystalline core and continue to be present as the encapsulating layers illustrated in FIG. 1 are formed. The CMP process provides a substantially planar surface free of voids, particles, or other features, which can then be used during a wafer transfer process to bond the single crystal layer 122 (e.g., a single crystal silicon layer) to the bonding layer 120. It will be appreciated that the bonding layer does not have to be characterized by an atomically flat surface, but should provide a substantially planar surface that will support bonding of the single crystal layer (e.g., a single crystal silicon layer) with the desired reliability.

A layer transfer process is used to join the single crystal layer 122 (e.g., a single crystal silicon layer) to the bonding layer 120. In some embodiments, a silicon wafer including the substantially single crystal layer 122 (e.g., a single crystal silicon layer) is implanted to form a cleavage plane. In this embodiment, after wafer bonding, the silicon substrate can be removed along with the portion of the single crystal silicon layer below the cleavage plane, resulting in an exfoliated single crystal silicon layer. The thickness of the single crystal layer 122 can be varied to meet the specifications of various applications. Moreover, the crystal orientation of the single crystal layer 122 can be varied to meet the specifications of the application. Additionally, the doping levels and profile in the single crystal layer can be varied to meet the specifications of the particular application. In some embodiments, the depth of the implant may be adjusted to be greater than the desired final thickness of single crystal layer 122. The additional thickness allows for the removal of the thin portion of the transferred substantially single crystal layer that is damaged, leaving behind the undamaged portion of the desired final thickness. In some embodiments, the surface roughness can be modified for high quality epitaxial growth. One of ordinary skill in the art would recognize many variations, modifications, and alternatives.

In some embodiments, the single crystal layer 122 can be thick enough to provide a high quality lattice template for the subsequent growth of one or more epitaxial layers but thin enough to be highly compliant. The single crystal layer 122 may be said to be "compliant" when the single crystal layer 122 is relatively thin such that its physical properties are less constrained and able to mimic those of the materials surrounding it with less propensity to generate crystalline defects. The compliance of the single crystal layer 122 may be inversely related to the thickness of the single crystal layer 122. A higher compliance can result in lower defect densities in the epitaxial layers grown on the template and enable thicker epitaxial layer growth. In some embodiments, the thickness of the single crystal layer 122 may be increased by epitaxial growth of silicon on the exfoliated silicon layer.

In some embodiments, adjusting the final thickness of the single crystal layer 122 may be achieved through thermal oxidation of a top portion of an exfoliated silicon layer, followed by an oxide layer strip with hydrogen fluoride (HF) acid. For example, an exfoliated silicon layer having an initial thickness of 0.5 μm may be thermally oxidized to create a silicon dioxide layer that is about 420 nm thick. After removal of the grown thermal oxide, the remaining silicon thickness in the transferred layer may be about 53 nm. During thermal oxidation, implanted hydrogen may migrate toward the surface. Thus, the subsequent oxide layer strip may remove some damage. Also, thermal oxidation is typically performed at a temperature of 1000° C. or higher. The elevated temperature can may also repair lattice damage.

The silicon oxide layer formed on the top portion of the single crystal layer during thermal oxidation can be stripped using HF acid etching. The etching selectivity between silicon oxide and silicon ($SiO_2$:Si) by HF acid may be adjusted by adjusting the temperature and concentration of the HF solution and the stoichiometry and density of the silicon oxide. Etch selectivity refers to the etch rate of one material relative to another. The selectivity of the HF solution can range from about 10:1 to about 100:1 for (SiO2:Si). A high etch selectivity may reduce the surface roughness by a similar factor from the initial surface roughness. However, the surface roughness of the resultant single crystal layer 122 may still be larger than desired. For example, a bulk Si (111) surface may have a root-mean-square (RMS) surface roughness of less than 0.1 nm as determined by a 2 μm×2 μm atomic force microscope (AFM) scan before additional processing. In some embodiments, the desired surface roughness for epitaxial growth of gallium nitride materials on Si (111) may be, for example, less than 1 nm, less than 0.5 nm, or less than 0.2 nm, on a 30 μm×30 μm AFM scan area.

If the surface roughness of the single crystal layer 122 after thermal oxidation and oxide layer strip exceeds the desired surface roughness, additional surface smoothing may be performed. There are several methods of smoothing a silicon surface. These methods may include hydrogen annealing, laser trimming, plasma smoothing, and touch polish (e.g., CMP). These methods may involve preferential attack of high aspect ratio surface peaks. Hence, high aspect ratio features on the surface may be removed more quickly than low aspect ratio features, thus resulting in a smoother surface.

It should be appreciated that the specific steps illustrated in FIG. 5 provide a particular method of fabricating an engineered substrate according to an embodiment of the present invention. Other sequences of steps may also be performed according to alternative embodiments. For example, alternative embodiments of the present invention may perform the steps outlined above in a different order. Moreover, the individual steps illustrated in FIG. 5 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 6:
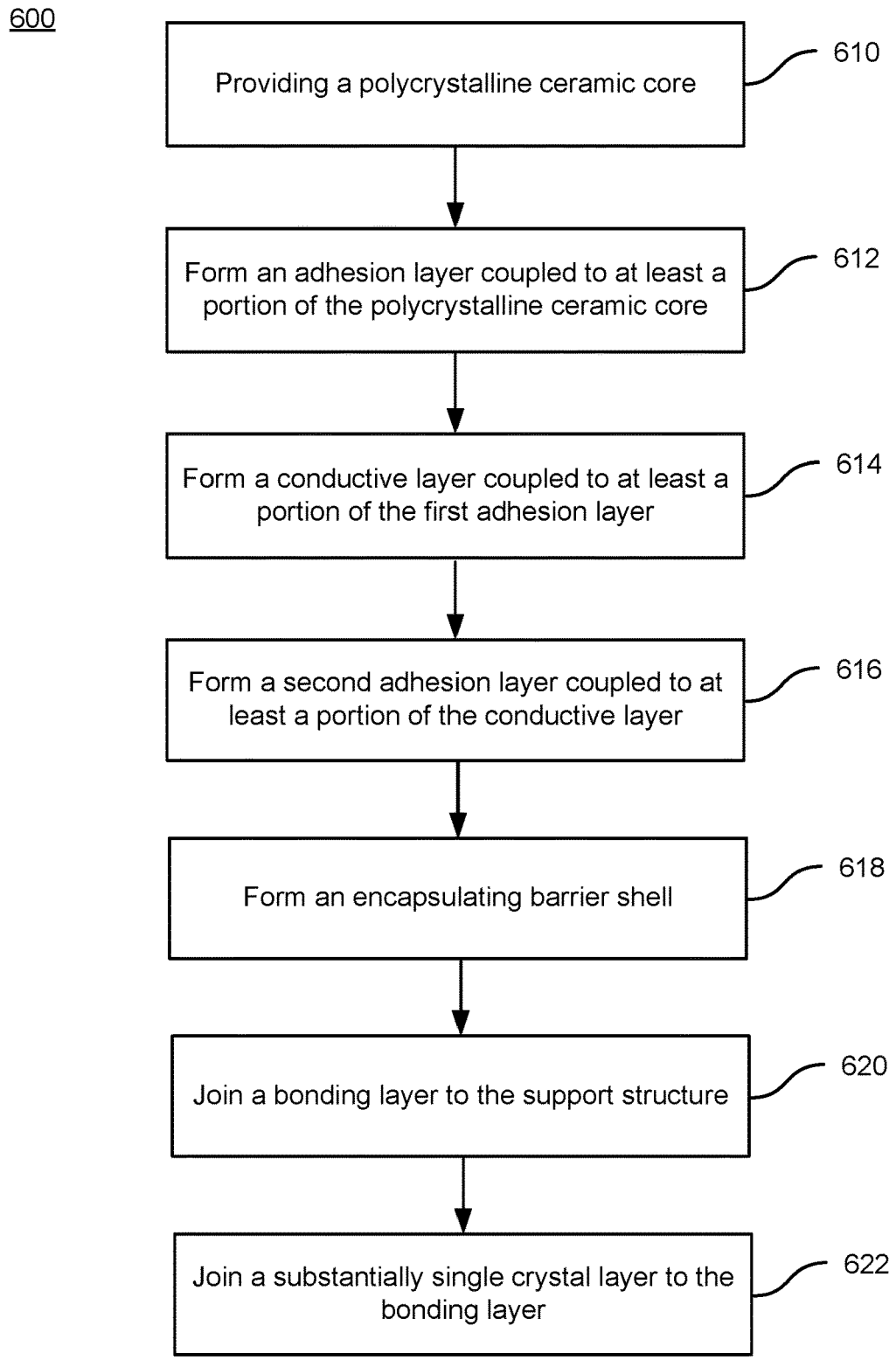
FIG. 6 is a simplified flowchart illustrating a method of fabricating an engineered substrate according to another embodiment of the present invention.

FIG. 6 is a simplified flowchart illustrating a method of fabricating an engineered substrate according to another embodiment of the present invention. The method includes forming a support structure by providing a polycrystalline ceramic core (610), forming an adhesion layer coupled to at least a portion of the polycrystalline ceramic core (612). The first adhesion layer can include a tetraethyl orthosilicate (TEOS) oxide layer. The first adhesion layer can be formed as a single layer of TEOS oxide. The method also includes forming a conductive layer coupled to the first adhesion layer (614). The conductive layer can be a polysilicon layer. The conductive layer can be formed as a single layer of polysilicon.

The method also includes forming a second adhesion layer coupled to at least a portion of the first adhesion layer (616) and forming a barrier shell (618). The second adhesion layer can be formed as a single layer of TEOS oxide. The barrier shell can be formed as a single layer of silicon nitride or a series of sub-layers forming the barrier shell.

Once the support structure is formed by processes 610-618, the method further includes joining a bonding layer (e.g., a silicon oxide layer) to the support structure (620) and joining a single crystal silicon layer or a substantially single crystal layer to the silicon oxide layer (622). The joining of the bonding layer can include deposition of a bonding material followed by planarization processes as described herein. In an embodiment as described below, joining the single crystal layer (e.g., a single crystal silicon layer) to the bonding layer utilizes a layer transfer process in which the single crystal silicon layer is transferred from a silicon wafer.

It should be appreciated that the specific steps illustrated in FIG. 6 provide a particular method of fabricating an engineered substrate according to another embodiment of the present invention. Other sequences of steps may also be performed according to alternative embodiments. For example, alternative embodiments of the present invention may perform the steps outlined above in a different order. Moreover, the individual steps illustrated in FIG. 6 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 7:
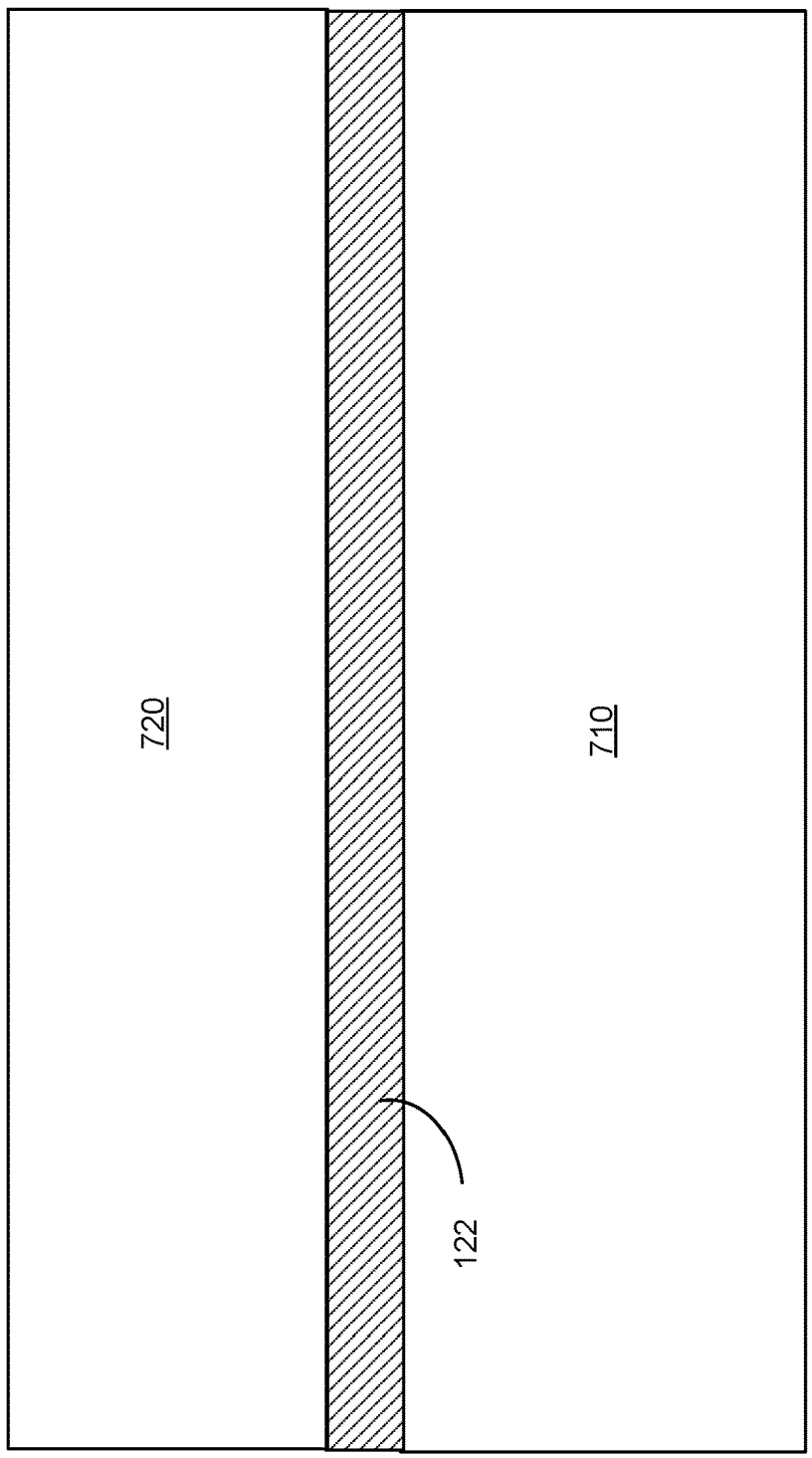
FIG. 7 is a simplified schematic cross-sectional diagram illustrating an epitaxial/engineered substrate structure for RF and power applications according to an embodiment of the present invention.

FIG. 7 is a simplified schematic cross-sectional diagram illustrating an epitaxial/engineered substrate structure 700 for RF and power applications according to an embodiment of the present invention. In some LED applications, the engineered substrate structure provides a growth substrate that enables the growth of high quality GaN layers and the engineered substrate structure is subsequently removed. However, for RF and power device applications, the engineered substrate structure forms portions of the finished device and as a result, the electrical, thermal, and other properties of the engineered substrate structure or elements of the engineered substrate structure are important to the particular application.

Referring to FIG. 1, the single crystal layer 122 can be an exfoliated single crystal silicon layer split from a silicon donor wafer using an implant and exfoliation technique. Typical implants are hydrogen and boron. For power and RF device applications, the electrical properties of the layers and materials in the engineered substrate structure are of importance. For example, some device architectures utilize highly insulating silicon layers with resistance greater than 103 Ohm-cm to reduce or eliminate leakage through the substrate and interface layers. Other applications utilized designs that include a conductive silicon layer of a predetermined thickness (e.g., 1 μm) in order to connect the source of the device to other elements. Thus, in these applications, control of the dimensions and properties of the single crystal silicon layer is desirable. In design in which implant and exfoliation techniques are used during layer transfer, residual implant atoms, for example, hydrogen or boron, are present in the silicon layer, thereby altering the electrical properties. Additionally, it can be difficult to control the thickness, conductivity, and other properties of thin silicon layers, using, for example, adjustments in the implant dose, which can affect conductivity, and implant depth, which can affect layer thickness.

According to embodiments of the present invention, silicon epitaxy on an engineered substrate structure is utilized to achieve desired properties for the single crystal silicon layer as appropriate to particular device designs.

Referring to FIG. 7, the epitaxial/engineered substrate structure 700 includes an engineered substrate structure 710 and an epitaxial single crystal layer 720 formed thereon. In some embodiments, the epitaxial single crystal layer 720 can be a single crystal silicon layer. The engineered substrate structure 710 can be similar to the engineered substrate structures illustrated in FIGS. 1, 3, and 4. Typically, the single crystal layer 122 (for example, a single crystal silicon layer) is on the order of 0.5 μm after layer transfer. Surface conditioning processes can be utilized to reduce the thickness of the single crystal layer 122 to about 0.3 μm in some processes. In order to increase the thickness of the single crystal layer 122 to about 1 μm for use in making reliable ohmic contacts, for example, an epitaxial process is used to grow epitaxial single crystal layer 720 on the single crystal layer 122 formed by the layer transfer process. A variety of epitaxial growth processes can be used to grow epitaxial single crystal layer 720, including CVD, LPCVD, ALD, MBE, or the like. The epitaxial single crystal layer 720 can include, for example, Si, SiC, sapphire, GaN, AlN, SiGe, Ge, Diamond, $Ga_2O_3$, and/or ZnO. The thickness of the epitaxial single crystal layer 720 can range from about 0.1 μm to about 20 μm, for example between 0.1 μm and 10 μm.

Figure 8A:
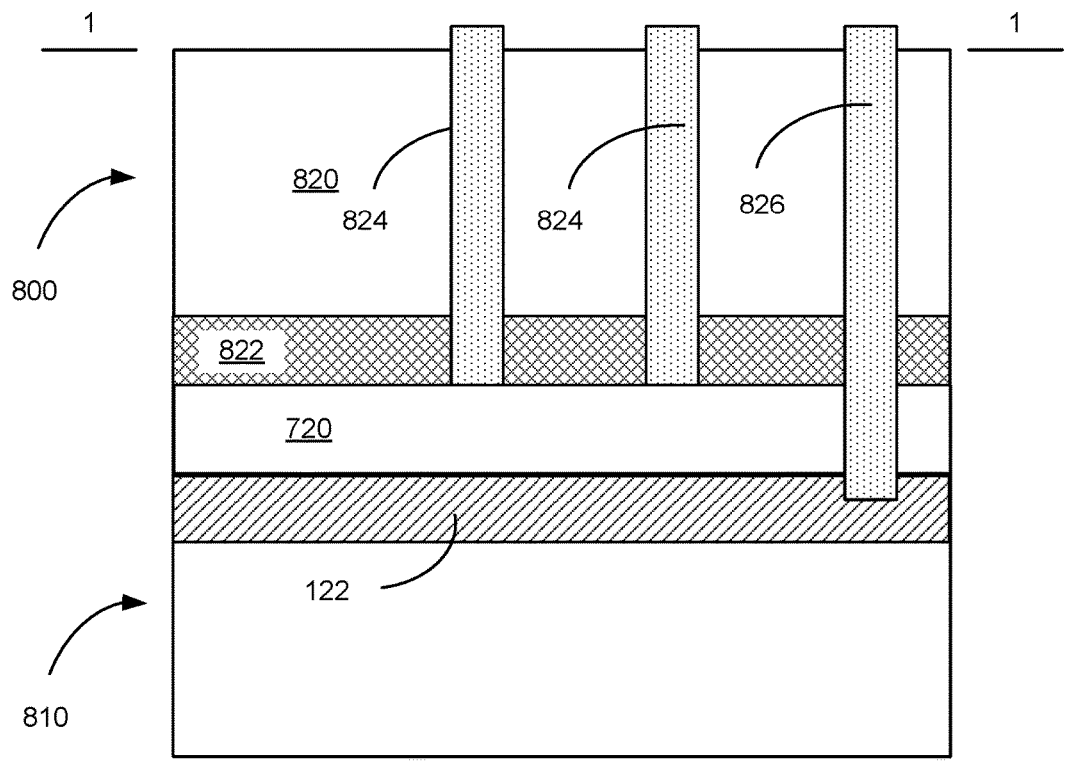
FIG. 8A is a simplified schematic diagram illustrating a III-V epitaxial layer on an engineered substrate structure according to an embodiment of the present invention.

FIG. 8A is a simplified schematic cross-sectional diagram illustrating a III-V epitaxial layer on an engineered substrate structure according to an embodiment of the present invention. The structure illustrated in FIG. 8A can be referred to as a double epitaxial structure 800 as described below. As illustrated in FIG. 8A, an engineered substrate structure 810 including an epitaxial single crystal layer 720 has a III-V epitaxial layer 820 formed thereon. In an embodiment, the III-V epitaxial layer comprises gallium nitride (GaN). In order to provide for electrical conductivity between portions of the III-V epitaxial layer, which can include multiple sub-layers, a set of vias 824 are formed passing, in this example, from a top surface of the III-V epitaxial layer 820, into the epitaxial single crystal layer 720. FIG. 8A shows the vias 824 extending through the epitaxial layer 820 to the epitaxial single crystal layer 720. As an example, these vias could be used to connect an electrode of a diode or a transistor to the underlying layer by providing an ohmic contact through the vias 824, thereby relaxing charge build up in the device. In some embodiments, one or more vias 824 may be insulated on its side wall so that it is not electrically connected to the III-V epitaxial layer 820. The electrical contact may facilitate the removal of parasitic charges, thereby enabling faster switching of the power device.

In some embodiments, the via 826 can extend to the single crystal layer 122. In order to address the difficulty of fabricating via 826 to contact the single crystal layer 122, additional conducting epitaxial layers 822 can be grown on the single crystal layer 122 and single crystal layer 720 to increase the size of a target conducting layer for the via 826, that is, the thickness of the layer in which the via terminates. Epitaxial single crystal layer 720 and III-V epitaxial layers 820 can be formed thicker than on conventional substrates because of the unique CTE and diffusion properties of the engineered substrate structure 810. Therefore, existing substrate technologies cannot support the growth of enough defect free epitaxial layers to include conducting epitaxial layers 822 in a device. In some embodiments, the conducting epitaxial layers 822 can be AlN, AlGaN, GaN or a sufficiently doped semiconductor material. In particular embodiments, the thickness of the conducting epitaxial layers 822 can be 0.1-10 μm. In other embodiments, the thickness of the conducting epitaxial layers 822 can vary depending on the semiconductor device requirements. In some embodiments, the engineered substrate structure and the single crystal layer 122 can be removed exposing the epitaxial single crystal layer 720 and or the conducting epitaxial layers 822. A contact can be formed on the exposed epitaxial layers after substrate removal. One of ordinary skill in the art would recognize many variations, modifications, and alternatives.

In some embodiments, the III-V epitaxial layer can be grown on the single crystal layer 122. In order to terminate the vias in the single crystal layer 122, an ohmic contact using the vias can be made in a 0.3 μm single crystal layer across an entire wafer. Utilizing embodiments of the present invention, it is possible to provide single crystal layers multiple microns in thickness. Multiple micron thickness is difficult to achieve using implant and exfoliation processes since large implant depth requires high implant energy. In turn, the thick epitaxial single crystal layers enable applications such as the illustrated vias that enable a wide variety of device designs.

In addition to increasing the thickness of the "layer" by epitaxially growing the epitaxial single crystal layer 720 on the single crystal layer 122, other adjustments can be made to the original properties of the single crystal layer 122, including modifications of the conductivity, crystallinity, and the like. For example, if a silicon layer on the order of 10 μm is desired before additional epitaxial growth of III-V layers or other materials, such a thick layer can be grown according to embodiments of the present invention.

The implant process can impact the properties of the single crystal layer 122, for example, residual boron/hydrogen atoms can cause defects that influence the electrical properties of a silicon crystal layer. In some embodiments of the present invention, a portion of the single crystal layer 122 can be removed prior to epitaxial growth of the epitaxial single crystal layer 720. For example, a single crystal silicon layer can be thinned to form a layer 0.1 µm in thickness or less, removing most or all of the residual boron/hydrogen atoms. Subsequent growth of a single crystal silicon layer is then used to provide a single crystal material with electrical and/or other properties substantially independent of the corresponding properties of the layer formed using layer transfer processes.

In addition to increasing the thickness of the single crystal silicon material coupled to the engineered substrate structure, the electrical properties, including the conductivity of the epitaxial single crystal layer 720, can be different from that of the single crystal layer 122. Doping of the epitaxial single crystal layer 720 during growth can produce P-type silicon by doping with boron and N-type silicon by doping with phosphorus. Undoped silicon can be grown to provide high resistivity silicon used in devices that have insulating regions. Insulating layers can be of use in RF devices, in particular.

The lattice constant of the epitaxial single crystal layer 720 can be adjusted during growth to vary from the lattice constant of the single crystal layer 122 to produce strained epitaxial material. In addition to silicon, other elements can be grown epitaxially to provide layers, including strained layers, that include silicon germanium, or the like. Additionally, the crystal orientation of the crystal planes, for example growth of (111) silicon on (100) silicon, can be utilized to introduce strain. For instance, buffer layers can be grown on the single crystal layer 122, on the epitaxial single crystal layer 720, or between layers, to enhance subsequent epitaxial growth. These buffer layers could include III-V semiconductor material layers such as aluminum gallium nitride, indium gallium nitride, and indium aluminum gallium nitride, silicon germanium strained layers, and the like. The strain of the III-V semiconductor material layers can be adjusted for desired material properties. Additionally, the buffer layers and other epitaxial layers can be graded in mole fraction, dopants, polarity, or the like. One of ordinary skill in the art would recognize many variations, modifications, and alternatives.

In some embodiments, strain present in the single crystal layer 122 or the epitaxial single crystal layer 720 may be relaxed during growth of subsequent epitaxial layers, including III-V epitaxial layers.

Figure 8B:
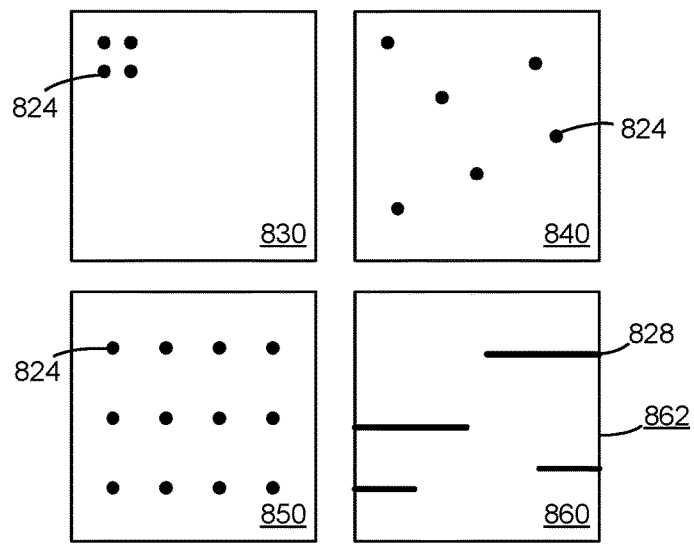
FIG. 8B is a simplified schematic plan view illustrating via configurations for a semiconductor device formed on an engineered substrate according to another embodiment of the present invention.

FIG. 8B is a simplified schematic plan view diagram illustrating four double epitaxial structures according to an embodiment of the present invention. The double epitaxial structures illustrated in FIG. 8B each include a set of vias 824. A first double epitaxial structure 830 shows a tight via configuration. A second double epitaxial structure 840 shows a dispersed via configuration. The dispersed via configuration uses vias 824 in active regions of the device more likely to experience charge build up. A third double epitaxial structure 850 shows a pattern via configuration. The pattern via configuration can space vias 824 equal distances across the double epitaxial structure 850. A fourth double epitaxial structure 860 illustrates lateral vias 828. Lateral vias 828 can be fabricated to travel substantially parallel to the epitaxial layers of the double epitaxial structure 860 and contact the single crystal layer 122 at, for example, an edge 862. One of ordinary skill in the art would recognize many variations, modifications, and alternatives.

The engineered substrates as described above may afford epitaxial growth of gallium nitride device layers thereon that are substantially lattice matched to the engineered substrates and are characterized by a coefficient of thermal expansion (CTE) that is substantially matched to that of the engineered substrates. Thus, engineered substrates may provide superior thermal stability and shape control. The engineered substrates may also enable wafer diameter scaling with reuse capability. Relatively thick (e.g., greater than 20 µm) high quality epitaxial gallium nitride layers may be formed on the engineered substrates that are crack free and characterized by low defect density and low post-epitaxial bow and stress. Multiple applications, such as power devices, radio frequency (RF) devices, monolithic microwave integrated circuits (MMICs), displays, light-emitting diodes (LEDs), and the like, may be implemented on a single platform. Such engineered substrates may also be suitable for various device architectures, such as lateral devices, vertical devices, chip scale package (CSP) devices, and the like.

Gallium nitride (GaN) and similar wide bandgap semiconductor materials offer physical properties superior to those of silicon, which allow for power semiconductor devices based on these materials to withstand high voltages and temperatures. These properties also permit higher frequency response, greater current density and faster switching. However, before wide bandgap devices can gain commercial acceptance, their reliability must be proven and the demand for higher reliability is growing. The continuous drive for greater power density at the device and package levels creates consequences in terms of higher temperatures and temperature gradients across the package. Using engineered substrates for forming CTE-matched epitaxial device layers may alleviate many thermal-related failure mechanisms common for wide bandgap devices, as described below.

Compound semiconductor devices, such as gallium nitride (GaN) based high electron mobility transistors (HEMTs), may be subjected to high electric fields and high currents (e.g., large signal RF), while being driven into deep saturation. Contact degradation, inverse piezoelectric effects, hot electron effects, and self-heating are among some of the common problems. For example, Schottky and ohmic contacts may show increase in contact resistance and exhibit passivation cracking for temperatures greater than about 300° C. Inter-diffusion within the gate metal stack and gallium out-diffusion into the metal layers may occur. Hot electron effect may occur when electrons accelerated in a large electric field gains very high kinetic energy. Hot electron effect may lead to trap formation in aluminum gallium nitride (AlGaN) layers, at AlGaN/GaN interfaces, at passivation layer/GaN cap layer interface, and in buffer layers.

Trap formation may in turn cause current collapse and gate lag, and thereby result in reversible degradations of transconductance and saturated drain current. Slow current transients are observed even if the drain voltage or gate voltage is changed abruptly. The slow transient response of the drain current when the drain-source voltage is pulsed is called the drain lag, or gate lag in the case of the gate-source voltage. When the voltage within the pulse is higher than the quiescent bias point, the buffer traps capture free charges. This phenomenon is very fast compared to the pulse length. When the voltage within the pulse is lower than the quiescent bias point, the traps release their charges. This process can be very slow, possibly even in a few seconds. As the free carriers are captured and released, they do not contribute to the output current instantaneously. This phenomenon is at the origin of current transients.

The combined effect of drain lag and gate lag leads to current collapse (reduction in the two-dimensional electron gas [2-DEG] density). The gate lag due to buffer traps becomes more pronounced when the deep-acceptor density in the buffer layer is higher. Inverse piezoelectric effect may occur when high reverse bias on the gate leads to crystallographic defect generation. Beyond a certain critical voltage, irreversible damage to a device may occur, which can provide a leakage path through the defects. Self-heating may occur under high power stress and may result in thermal stress-strain. Compound semiconductor devices may also suffer from electric field driven degradations, such as gate metallization and degradations of at contacts, surfaces, and interfaces. Gate degradations may lead to increases in leakage current and dielectric breakdown.

High Temperature Reverse Bias (HTRB) test is one of the most common reliability tests for power devices. An HTRB test evaluates long-term stability under high drain-source bias. HTRB tests are intended to accelerate failure mechanisms that are thermally activated through the use of biased operating conditions. During an HTRB test, the device samples are stressed at or slightly less than the maximum rated reverse breakdown voltage at an ambient temperature close to their maximum rated junction temperature over an extended period (e.g., 1,000 hours). This test's high temperature accelerates failure mechanisms according to the Arrhenius equation, which states the temperature dependence of reaction rates. Delamination, popping, device blow-up, and other mechanical issues may occur during HTRB tests.

Failure mechanisms similar to time-dependent dielectric breakdown (TDDB), a common failure mechanism in MOSFETs, are also observed in gate dielectrics of wide bandgap semiconductor devices, such as GaN power devices. TDDB happens when the gate dielectric breaks down because of long-time application of relatively low electric field (as opposite to immediate breakdown, which is caused by strong electric field). In addition, failures during temperature cycling (TMCL) may be related to package stress, bond pad metallization, mold compound, moisture sensitivity, and other package-level issues.

As discussed above, the engineered substrates may have CTEs matched to that of the epitaxial GaN device layers grown thereon. The epitaxial GaN device layers may also be lattice matched to the engineered substrates. Therefore, the epitaxial GaN device layers may have lower defect densities and higher qualities. Relatively thick drift regions may be formed by epitaxial growth. Also, large diameter wafers may be made from the engineered substrates, thereby lower manufacturing costs. The engineered substrates may improve device reliability. For example, having CTEs matched to that of the epitaxial GaN devices may help mitigate thermal stress, which is a critical factor in device reliability. Device failures related to thermal stress may include thermally-activated drain-source breakdown, punch through effect, breakdown along the channel, breakdown through the buffer layer. Self-heating may also be reduced. In addition, high quality epitaxial GaN layers with low defect density may help improve device reliability, as some defects may be activated with voltage stress and may contribute to lateral and vertical leakage. High quality epitaxial GaN layers may also address issues such as localized non-stoichiometric regions that can affect field distributions and dislocation densities.

Traditional silicon-based MOSFET technology is nearly hitting the physical limit of performance and switching speeds. Lateral GaN-based high electron mobility transistors (HEMTs) offer an opportunity to go beyond silicon-based MOSFET realm in medium to low-power systems, such as solar inverters, compact power supply (PFC), switch-mode power supply (SMPS), motor drives, RF power amplifiers, solid state lighting (SSL), smart grid, and automotive motor drive systems. Lateral GaN-based HEMTs may afford high efficiency, high-frequency operation, and low switching and conduction loss, among many other advantages.

Figure 9:
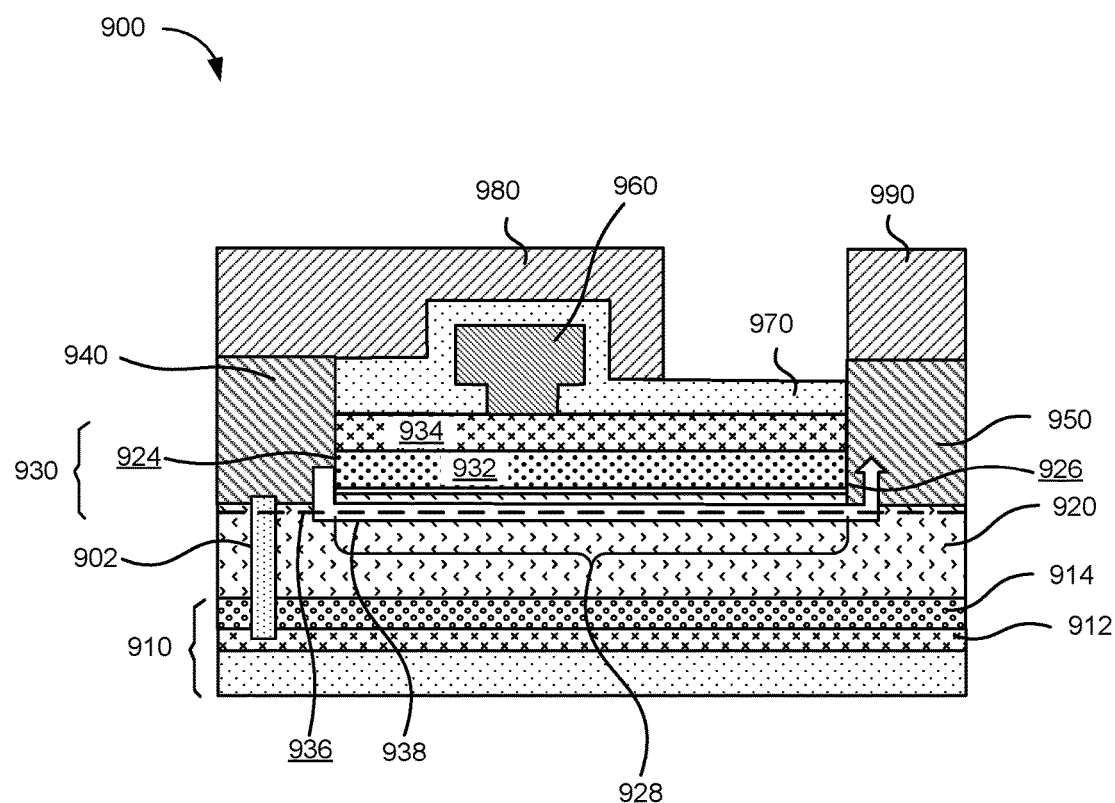
FIG. 9 is a simplified schematic cross-sectional diagram illustrating a lateral power device formed on an engineered substrate according to an embodiment of the present invention.

FIG. 9 is a simplified schematic cross-sectional diagram illustrating a power device 900 formed on an engineered substrate 910 according to an embodiment of the present invention. The power device 900 may function as a depletion-mode (normally ON) HEMT. The power device 900 includes the engineered substrate 910. In some embodiments, as described above with references to FIGS. 1, 3, and 4, the engineered substrate 910 may include a polycrystalline ceramic core, a first adhesion layer coupled to the polycrystalline ceramic core, a barrier layer coupled to the first adhesion layer, a bonding layer coupled to the barrier layer, and a substantially single crystal layer coupled to the bonding layer. According to an embodiment, the engineered substrate 910 may further include a substantially single crystal layer 912 coupled to the bonding layer. For example, the substantially single crystal layer 912 may comprise substantially single layer crystalline silicon. In some embodiments, the engineered substrate 910 may further include a nucleation layer 914 coupled to the substantially single crystal layer 912 for facilitating the formation of the epitaxial device layers including substantially single crystal GaN-based materials. In some embodiments the nucleation layer 914 may be doped at levels equal to, less than, or greater than the surrounding layers. In other embodiments, the composition of the nucleation layer may be designed and implemented with a predetermined composition.

In another embodiment, the polycrystalline ceramic core of the substrate 910 comprises aluminum nitride. In some embodiments, as discussed above with reference to FIG. 1, the substrate 910 may further includes a conductive layer coupled to the first adhesion layer, and a second adhesion layer coupled to the conductive layer, wherein the conductive layer and the second adhesion layer are disposed between the first adhesion layer and the barrier layer. In some embodiments, the first adhesion layer may comprise a first tetraethyl orthosilicate (TEOS) oxide layer, and the second adhesion layer may comprise a second TEOS oxide layer. The barrier layer may comprise a silicon nitride layer. The conductive layer may comprise a polysilicon layer.

According to an embodiment, the power device 900 further includes a buffer layer 920 (e.g., a gallium nitride (GaN) buffer layer) coupled to the nucleation layer 914 and the substantially single crystal layer 912. The buffer layer 920 may be formed by epitaxial growth on either the nucleation layer 914 or the substantially single crystal layer 912. According to an embodiment, the buffer layer 920 may have a thickness greater than about 20 microns. In some embodiments, the buffer layer 920 can be replaced with an aluminum gallium nitride (i.e., $Al_xGa_{1-x}N$) buffer layer or be a combination of GaN and AlGaN layers. It should be noted that in some embodiments, layers discussed as GaN layers can be replaced with $Al_xGa_{1-x}N$ layers. As an example, the buffer layer 920 can be replaced with $Al_xGa_{1-x}N$ having a first set of mole fractions and the barrier layer 932 can be $Al_xGa_{1-x}N$ having a second set of mole fractions. One of ordinary skill in the art would recognize many variations, modifications, and alternatives.

A thicker buffer layer may afford the power device 900 a lower leakage current and a higher breakdown voltage. In some embodiments, the buffer layer 920 may include a plurality of layers. For example, the buffer layer 920 may comprise an aluminum nitride layer, an aluminum gallium nitride, and a gallium nitride layer. In some embodiments, the buffer layer 920 may include a superlattice of as many as 150 layers, each layer having a thickness of about 2-3 nm. A superlattice is an artificial lattice fabricated by a periodic epitaxial growth. A periodic superlattice is realized by growing alternate layers of two semiconductors on top of each other, each semiconductor being grown to the same thickness and mole fraction each time. According to some embodiments of the present invention, the advantage of using a superlattice instead of other buffer layer designs is that the superlattice can reduce the sheet resistance by growing, for example, AlGaN/GaN superlattice layers over the channel region and can reduce the potential barrier height at the hetero-interface. In other embodiments, the superlattice does not reduce the potential barrier height at the hetero-interface. One of ordinary skill in the art would recognize many variations, modifications, and alternatives.

According to an embodiment, the power device 900 further includes a channel region 930 coupled to the buffer layer 920. The channel region 930 has a first end 924, a second end 926, and a central portion 928 disposed between the first end and the second end. The central portion of the channel region 930 may include a channel region barrier layer. In some embodiments, the channel region barrier layer can be barrier layer 932 (e.g., an aluminum gallium nitride ($Al_xGa_{1-x}N$) barrier layer) coupled to the buffer layer 920, and a cap layer 934 (e.g., a gallium nitride cap layer) coupled to the barrier layer 932. The cap layer helps decrease the reverse leakage through the Schottky contact and reduce the peak electric field. It also protects the barrier layer 932 during processing and prevents nitrogen degassing. Additionally, cap layer 934 also has a positive impact on device performance such as increased gain, increased power added efficiency, and improved DC stability.

The power device 900 further includes a source contact 940 disposed at the first end of the channel region 930, a drain contact 950 disposed at the second end of the channel region 930, and a gate contact 960 coupled to the cap layer 934 and disposed in the central portion of the channel region 930. In some embodiments, a via 902 can connect the source contact 940 to the single crystal layer 912 in order to remove parasitic charges in the power device. In contrast with GaN on silicon, which can utilized backside contacts through a conductive silicon substrate, embodiments of the present invention utilizing an insulating engineered substrate can utilize vias such as via 902 to provide for electrical connectivity to the single crystal layer 912. According to embodiments of the present invention, the barrier layer 932 and the cap layer 934 are formed by epitaxial growth. As illustrated in FIG. 9, in operation, a thin layer of two-dimensional electron gas (2DEG) 936 may be formed in the buffer layer 920 at the interface between the buffer layer 920 and the barrier layer 932. The electrons in this thin layer of two-dimensional electron gas 936 can move quickly without colliding with any impurities because the buffer layer 920 is undoped. This may give a channel 938 very low resistivity, in other words, very high electron mobility.

In some embodiments, the power device 900 may further include a passivation layer 970 covering the cap layer 934. The passivation layer 970 may comprise silicon nitride or other insulating materials. The power device 900 may also include a first field plate metal 980 electrically connecting to the source contact 940 forming a source electrode and a second metal 990 disposed on the drain contact 950 forming a drain electrode.

Figure 10:
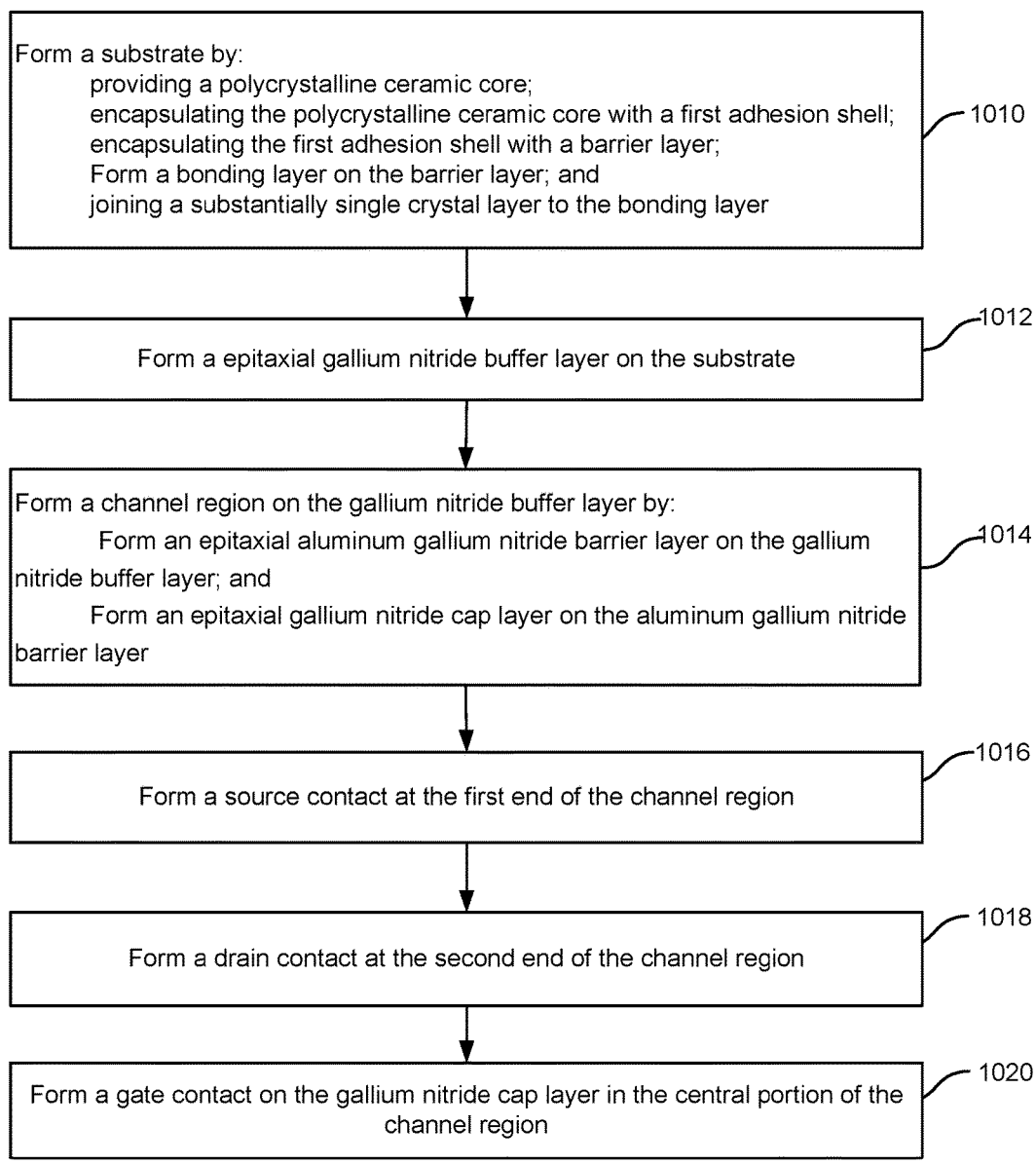
FIG. 10 is a simplified flowchart illustrating a method of fabricating a lateral power device on an engineered substrate according to an embodiment of the present invention.

FIG. 10 is a simplified flowchart illustrating a method 1000 of fabricating a lateral power device on an engineered substrate according to an embodiment of the present invention. According to an embodiment, the method 1000 includes, at 1010, forming a substrate by: providing a polycrystalline ceramic core, encapsulating the polycrystalline ceramic core with a first adhesion shell, encapsulating the first adhesion shell with a barrier layer, forming a bonding layer on the barrier layer, and joining a substantially single crystal layer to the bonding layer.

The method 1000 further includes, at 1012, forming an epitaxial buffer layer, (e.g., a gallium nitride (GaN) buffer layer) on the substrate; and at 1014, forming a channel region on the buffer layer by: forming an epitaxial barrier layer (e.g., an aluminum gallium nitride ($Al_xGa_{1-x}N$) barrier layer) on the buffer layer and forming an epitaxial cap layer, (e.g., a gallium nitride cap layer) on the barrier layer. The channel region has a first end and a second end, and a central portion between the first end and the second end.

The method 1000 further includes, at 1016, forming a source contact at the first end of the channel region; at 1018, forming a drain contact at the second end of the channel region; and at 1020 forming a gate contact on the cap layer in the central portion of the channel region.

It should be appreciated that the specific steps illustrated in FIG. 10 provide a particular method of fabricating an engineered substrate according to another embodiment of the present invention. Other sequences of steps may also be performed according to alternative embodiments. For example, alternative embodiments of the present invention may perform the steps outlined above in a different order. Moreover, the individual steps illustrated in FIG. 10 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 11A:
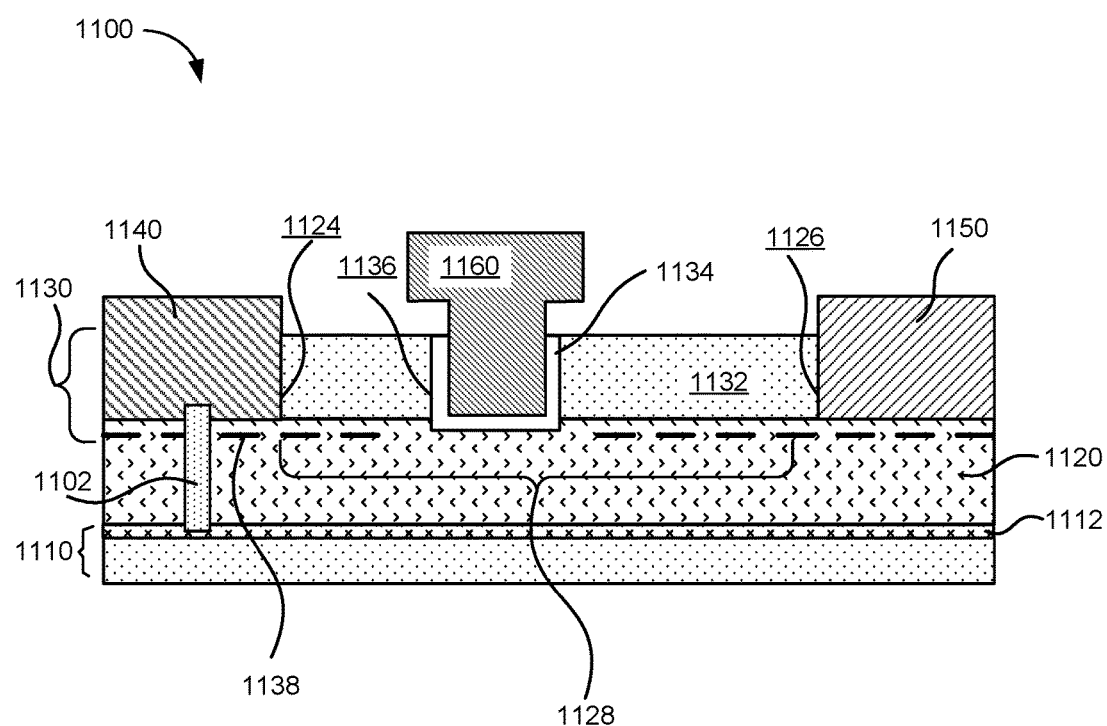
FIG. 11A is a simplified schematic cross-sectional diagram illustrating a lateral power device formed on an engineered substrate according to another embodiment of the present invention.

FIG. 11A is a simplified schematic cross-sectional diagram illustrating a lateral power device 1100 formed on an engineered substrate according to another embodiment of the present invention. The power device 1100 may use a recess 1136 in the channel region 1130 to function as an enhancement-mode (normally OFF) HEMT. The power device 1100 includes an engineered substrate 1110. In some embodiments, as described above with references to FIGS. 1, 3, and 4, the engineered substrate 1110 may include a polycrystalline ceramic core, a first adhesion layer coupled to the polycrystalline ceramic core, a barrier layer coupled to the first adhesion layer, a bonding layer coupled to the barrier layer, and a substantially single crystal layer coupled to the bonding layer. In some embodiments, the engineered substrate 1110 may further include a substantially single crystal layer 1112 coupled to the bonding layer. For example, the substantially single crystal layer 1112 may comprise substantially single crystalline silicon. In some embodiments, the engineered substrate 1110 may further include a nucleation layer (not shown) coupled to the substantially single crystal layer 1112 for facilitating the formation of the epitaxial device layers.

In one embodiment, the polycrystalline ceramic core of the substrate 1110 comprises aluminum nitride. In some embodiments, as discussed above with reference to FIG. 1, the substrate 1110 may further includes a conductive layer coupled to the first adhesion layer, and a second adhesion layer coupled to the conductive layer, wherein the conductive layer and the second adhesion layer are disposed between the first adhesion layer and the barrier layer. In some embodiments, the first adhesion layer may comprise a first tetraethyl orthosilicate (TEOS) oxide layer, and the second adhesion layer may comprise a second TEOS oxide layer. The barrier layer may comprise a silicon nitride layer. The conductive layer may comprise a polysilicon layer.

According to an embodiment, the power device 1100 further includes a buffer layer 1120 (e.g., a gallium nitride (GaN) buffer layer) coupled to the substantially single crystal layer 1112. The buffer layer 1120 may be formed by epitaxial growth on the substantially single crystal layer 1112. According to an embodiment, the buffer layer 1120 may have a thickness greater than about 20 microns. A thicker buffer layer may afford the power device 1100 a lower leakage current and a higher breakdown voltage. In some embodiments, the buffer layer 1120 may include a plurality of layers. For example, the buffer layer 1120 may be a superlattice that comprises an aluminum nitride layer, an aluminum gallium nitride, and a gallium nitride layer. It will be appreciate that one or nucleation layers may be utilized in the process for growth of the buffer layer 1120.

According to an embodiment, the power device 1100 further includes a channel region 1130 coupled to the buffer layer 1120. The channel region 1130 has a first end 1124, a second end 1126, and a central portion 1128 disposed between the first end 1124 and the second end 1126. The central portion of the channel region 1130 may include an epitaxial channel region barrier layer. In some embodiments, the epitaxial channel region barrier layer can be a barrier layer 1132 (e.g., an aluminum gallium nitride ($Al_xGa_{1-x}N$) barrier layer) coupled to the buffer layer 1120. According to embodiments of the present invention, the barrier layer 1132 is formed by epitaxial growth. The barrier layer 1132 includes a recess 1136 in the central portion of the channel region 1130. The recess may be formed by removing a portion of the barrier layer 1132 using etching or other suitable techniques. The power device 1100 further includes an insulating layer 1134 disposed in the recess and coupled to the barrier layer 1132.

The power device 1100 further includes a source contact 1140 disposed at the first end of the channel region 1130, a drain contact 1150 disposed at the second end of the channel region 1130, and a gate contact 1160 coupled to insulating layer 1134 and disposed in the central portion of the channel region 1130. In some embodiments, via 1102 can be used to connect the source contact 1140 to the single crystal layer 1112 in order to remove parasitic charges in the power device 1100. As illustrated in FIG. 11, a thin layer of two-dimensional electron gas (2DEG) 1138 may be formed in the buffer layer 1120 at the interface between the buffer layer 1120 and the barrier layer 1132. The electrons in this thin layer of 2DEG 1138 can move quickly without colliding with any impurities because the buffer layer 1120 is undoped. This may give the channel region 1130 very low resistivity, in other words, very high electron mobility. In depletion mode, (normally OFF), the recess 1136 and insulating layer 1134 block a portion of the 2DEG when the gate voltage is zero.

In some embodiments, the buffer layer 1120 can be implemented as an aluminum gallium nitride (AlGaN) buffer layer. The AlGaN buffer layer can include multiple layers. A power device that uses an $Al_xGa_{1-x}N$ buffer layer can introduce a channel region 1130 by fabricating the $Al_xGa_{1-x}N$ buffer layer with a first predetermined mole fraction (x) extending from the engineered substrate and a second predetermined mole fraction (x) near the source, gate, and drain contacts. The first predetermined mole fraction (x) can be low, for example, less than 10% to provide the desired carrier confinement. In other embodiments, the aluminum mole fraction (x) ranges from 10% to 30%. The $Al_xGa_{1-x}N$ epitaxial layer may be doped with iron or carbon to further increase the resistivity of the epitaxial layer, which serves as an insulating or blocking layer. Additional description related to materials used for the epitaxial buffer layer and fabrication of the epitaxial buffer layer is provided in U.S. Provisional Patent Application No. 62/447,857, the disclosure of which is hereby incorporated by reference in its entirety for all purposes.

Figure 11B:
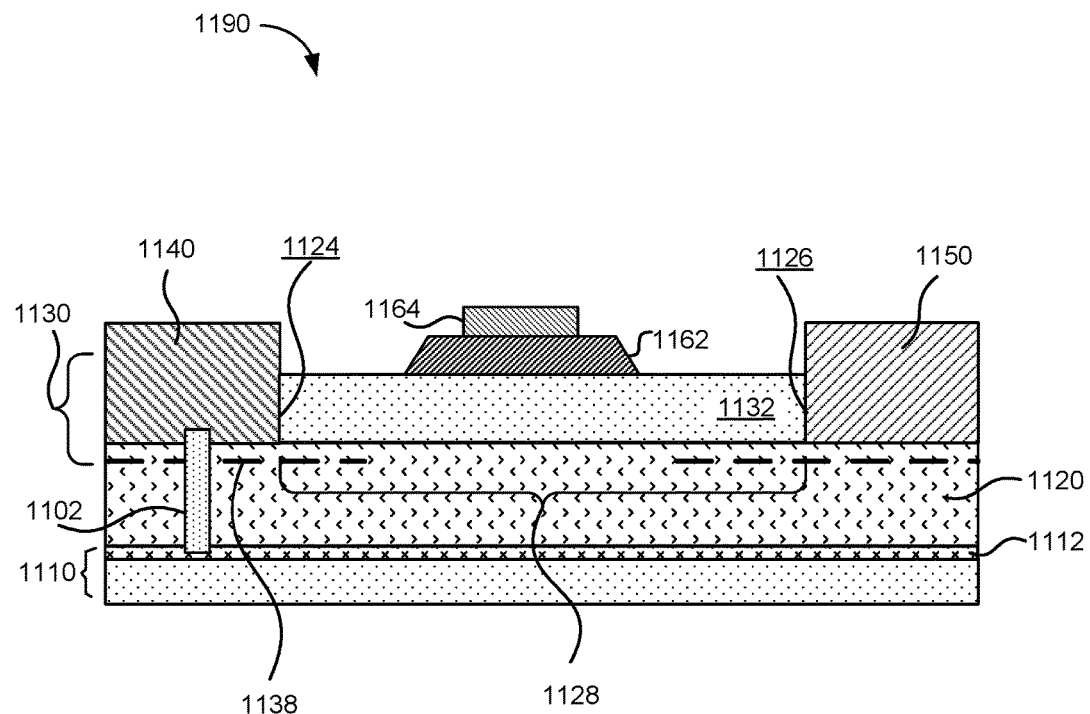
FIG. 11B is a simplified schematic cross-sectional diagram illustrating a lateral power device formed on an engineered substrate according to another embodiment of the present invention.

FIG. 11B is a simplified schematic cross sectional diagram illustrating a lateral power device 1190 with an epitaxial gate structure formed on an engineered substrate according to an embodiment of the present invention. The power device 1190 can function as an enhancement-mode (normally OFF) HEMT by using an epitaxial gate structure such as a P-type gallium nitride-based structure 1162 to deplete the charge in the channel region under zero bias. The power device 1190 includes an engineered substrate 1110. In some embodiments, the engineered substrate 1110 may include elements as described above with references to FIGS. 1, 3, and 4. According to an embodiment, the engineered substrate 1110 may further include a substantially single crystal layer 1112 coupled to the bonding layer.

In some embodiments, the power device 1190 further includes a buffer layer 1120 coupled to the substantially single crystal layer 1112. In some embodiments the buffer layer can be another single crystal epitaxial layer, for example, other III-V materials such as AlGaN, InGaN, InAlGaN, combinations thereof, and the like. The power device 1190 can include a channel region 1130 coupled to the buffer layer 1120. The central portion of the channel region can include a barrier layer 1132 coupled to the buffer layer 1120. According to embodiments of the present invention, the barrier layer 1132 is formed by epitaxial growth.

The power device 1190 further includes a source contact 1140 disposed at a first end of the channel region 1130, a drain contact 1150 disposed at a second end of the channel region, and a gate contact 1164. In some embodiments the gate contact 1164 can be a partially, or semi-ohmic contact, for example, titanium nitride. The partially ohmic gate contact 1164 can be coupled to a P-type GaN structure 1162. The partially ohmic gate contact 1164 functions to block leakage current that would flow if there were a fully ohmic contact. The P-type gallium nitride structure 1162 can be formed by selectively etching a P-type gallium nitride epitaxial layer. In some embodiments, the P-type gallium nitride structure 1162 can be formed using multiple epitaxial layers. When using multiple epitaxial layers, one or more layers can include materials with compositions that differ from the composition of the barrier layer 1132 or from each other, for example, AlGaN or the like.

The properties associated with the P-type gallium nitride structure 1162, such as strain and piezoelectric properties, can be adjusted to reduce or limit the leakage current. Each layer of the P-type gallium nitride structure can have a different dopant concentration. In some embodiments, the P-type gallium nitride structure 1162 depletes a portion of the channel region 1130 when the gate voltage is zero. The depleted region allows the power device 1190 to function as an enhancement-mode (normally OFF) HEMT.

Figure 11C:
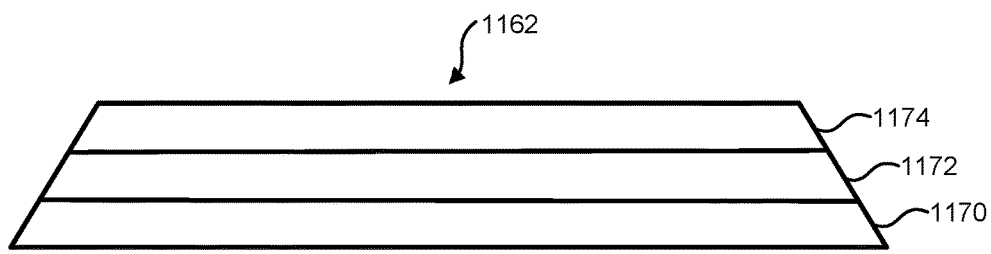
FIG. 11C is a simplified schematic cross sectional diagram illustrating an exploded view of the P-type gallium nitride structure according to an embodiment of the present invention.

FIG. 11C is a simplified schematic cross sectional diagram illustrating an exploded view of the P-type gallium nitride structure 1162. In some embodiments, a first layer 1170 can have a first dopant concentration and/or material composition. The second layer 1172 can have a second dopant concentration and/or material composition. The third layer 1174 can have a third dopant concentration and/or material composition. The unique CTE matching properties of the engineered substrate 1110 provide a substrate capable of supporting the growth of thicker and more complex epitaxial layers than existing substrate technologies. In some embodiments, the epitaxial gate structure can include at least one P-type gallium nitride epitaxial layer. The leakage current for power device 1190 can be controlled by the layer specific dopant concentrations and/or material compositions. Although FIG. 11C illustrates three epitaxial layers, one of ordinary skill in the art would recognize many variations, modifications, and alternatives.

Figure 12:
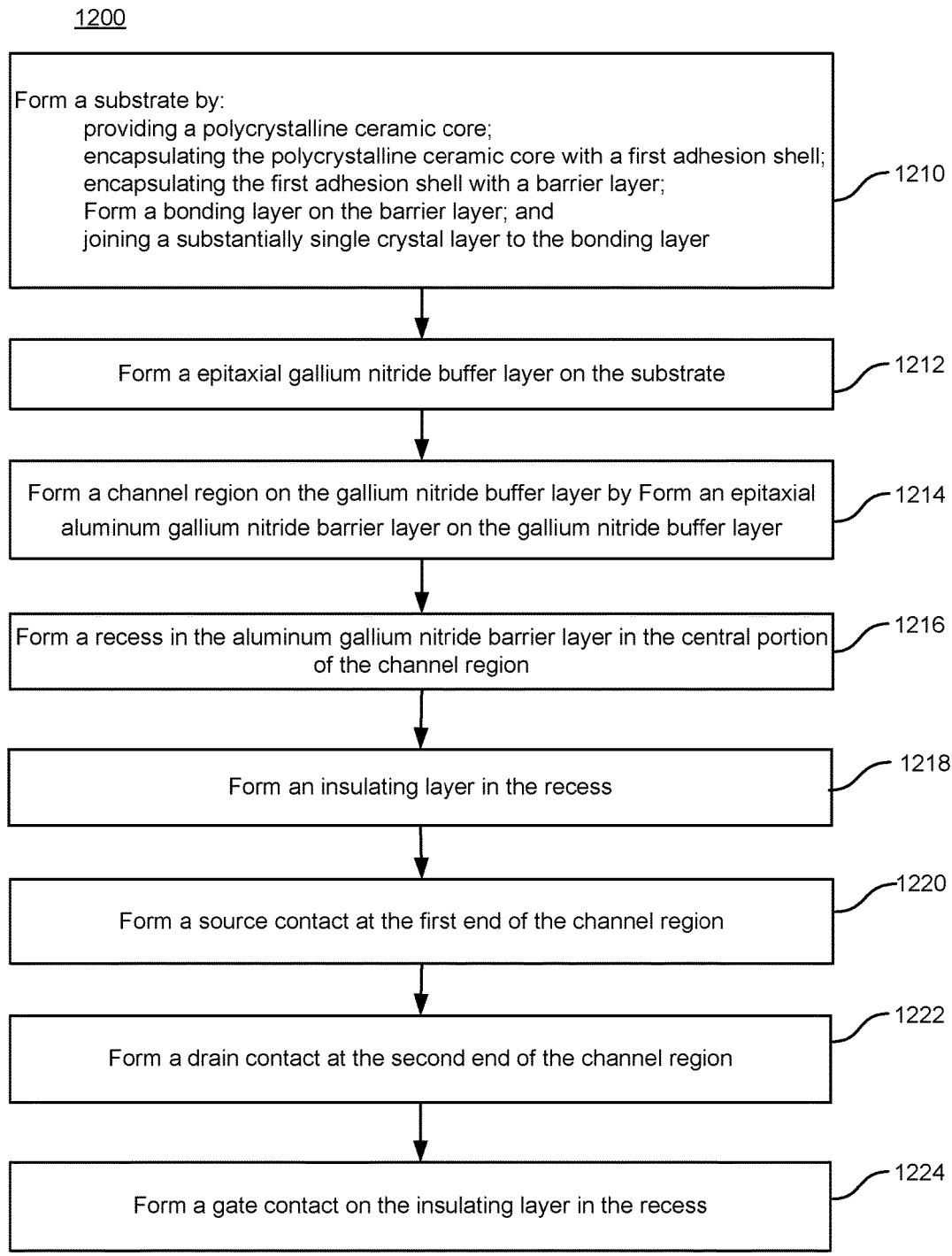
FIG. 12 is a simplified flowchart illustrating a method of fabricating a lateral power device on an engineered substrate according to another embodiment of the present invention.

FIG. 12 is a simplified flowchart illustrating a method 1200 of fabricating a lateral power device on an engineered substrate according to an embodiment of the present invention. According to an embodiment, the method 1200 includes, at 1210, forming a substrate by: providing a polycrystalline ceramic core, encapsulating the polycrystalline ceramic core with a first adhesion shell, encapsulating the first adhesion shell with a barrier layer, forming a bonding layer on the barrier layer, and joining a substantially single crystal layer to the bonding layer.

The method 1200 further includes, at 1212, forming an epitaxial buffer layer (e.g., a gallium nitride (GaN) buffer layer) on the substrate; and at 1214, forming a channel region on the buffer layer by forming an epitaxial barrier layer (e.g., an aluminum gallium nitride ($Al_xGa_{1-x}N$) barrier layer) on the buffer layer. The channel region has a first end and a second end, and a central portion between the first end and the second end. According to an embodiment, the method 1200 further includes, at 1216, forming a recess in the barrier layer in the central portion of the channel region; and at 1218, forming an insulating layer in the recess. The insulating layer is coupled to the barrier layer. The method 1200 further includes, at 1220, forming a source contact at the first end of the channel region; at 1222, forming a drain contact at the second end of the channel region; and at 1224, forming a gate contact on the insulating layer in the central portion of the channel region.

It should be appreciated that the specific steps illustrated in FIG. 12 provide a particular method of fabricating an engineered substrate according to another embodiment of the present invention. Other sequences of steps may also be performed according to alternative embodiments. For example, alternative embodiments of the present invention may perform the steps outlined above in a different order. Moreover, the individual steps illustrated in FIG. 12 may include multiple sub-steps that may be performed in various sequences as appropriate to the individual step. Furthermore, additional steps may be added or removed depending on the particular applications. One of ordinary skill in the art would recognize many variations, modifications, and alternatives.

High-power modules of vertical devices (p-n diodes and HEMTs) may have many applications. For example, they may be used to drive the main motor in a hybrid vehicle power system and industrial motors. Such devices present particular challenges because of the need for high voltage and high current at the same time. Currently, these systems typically use SiC-based devices. There is now growing interest in using GaN-based devices due to their switching performance, which affords smaller footprint. The engineered substrates as described above may provide the potential of manufacturing GaN-based devices on a mass scale in a CMOS-compatible Si fab.

Figure 13:
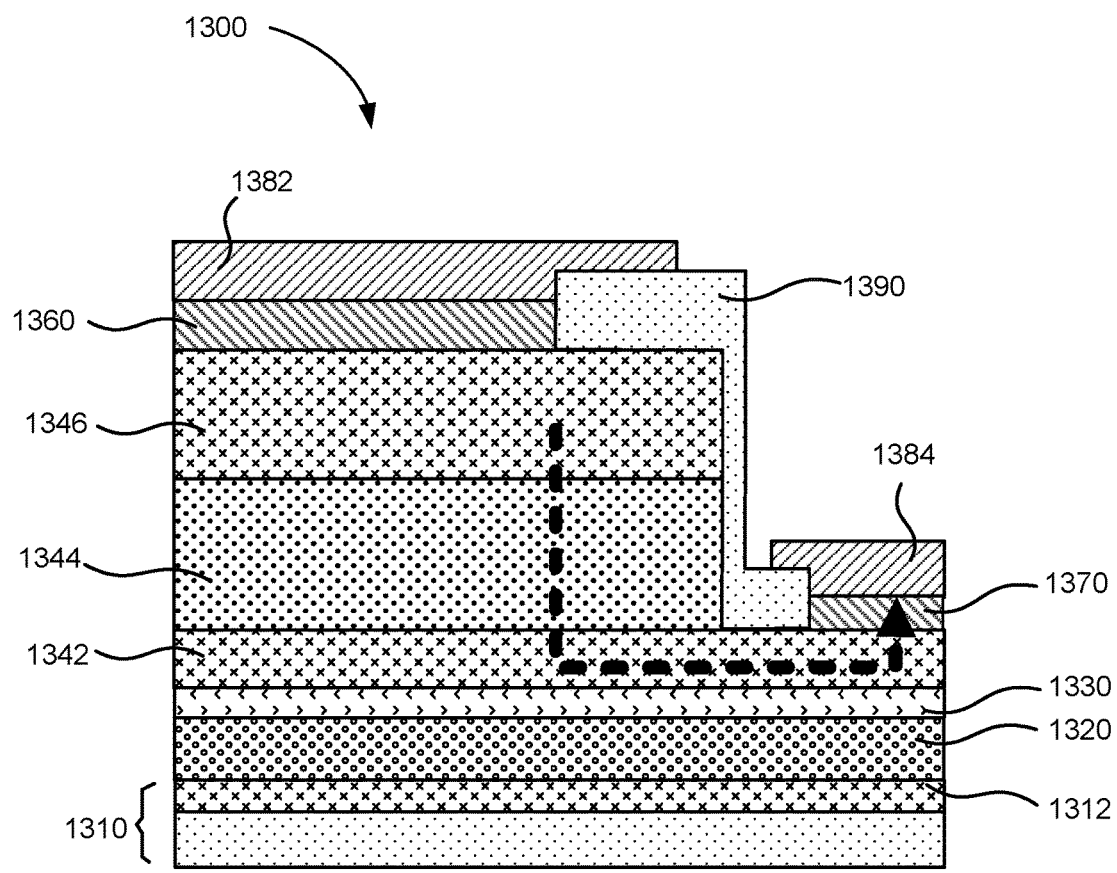
FIG. 13 is a simplified schematic cross-sectional diagram illustrating a vertical semiconductor diode formed on an engineered substrate according to an embodiment of the present invention.

FIG. 13 is a simplified schematic cross-sectional diagram illustrating a vertical semiconductor diode 1300 formed on an engineered substrate according to an embodiment of the present invention. The semiconductor diode 1300 includes an engineered substrate 1310. In some embodiments, as described above with references to FIGS. 1, 3, and 4, the engineered substrate 1310 may include a polycrystalline ceramic core, a first adhesion layer coupled to the polycrystalline ceramic core, a barrier layer coupled to the first adhesion layer, a bonding layer coupled to the barrier layer, and a substantially single crystal layer coupled to the bonding layer. According to an embodiment, the engineered substrate 1310 may further include a substantially single crystal layer 1312 coupled to the bonding layer. For example, the substantially single crystal layer 1312 may comprise substantially single crystalline silicon. In some embodiments, the engineered substrate 1310 may further include a nucleation layer (not shown) coupled to the substantially single crystal layer 1312 for facilitating the formation of the epitaxial device layers.

In one embodiment, the polycrystalline ceramic core of the substrate 1310 comprises aluminum nitride. In some embodiments, as discussed above with reference to FIG. 1, the substrate 1310 may further includes a conductive layer coupled to the first adhesion layer, and a second adhesion layer coupled to the conductive layer, wherein the conductive layer and the second adhesion layer are disposed between the first adhesion layer and the barrier layer. In some embodiments, the first adhesion layer may comprise a first tetraethyl orthosilicate (TEOS) oxide layer, and the second adhesion layer may comprise a second TEOS oxide layer. The barrier layer may comprise a silicon nitride layer. The conductive layer may comprise a polysilicon layer.

According to an embodiment, the semiconductor diode 1300 further includes a buffer layer 1320 coupled to the substantially single crystal layer 1312. In some embodiments, the buffer layer 1320 may be a superlattice that includes a plurality layers. For example, the buffer layer 1320 may include an aluminum nitride layer coupled to the single crystal silicon layer, an aluminum gallium nitride layer coupled to the aluminum nitride layer, and a gallium nitride layer coupled to the aluminum gallium nitride layer. The semiconductor diode 1300 further includes a semi-insulating layer 1330 coupled to the buffer layer 1320. In one embodiment, the semi-insulating layer 1330 comprises gallium nitride.

According to some embodiments, the semiconductor diode 1300 further includes a first N-type gallium nitride layer 1342 coupled to the semi-insulating layer 1330, a second N-type gallium nitride layer 1344 coupled to the first N-type gallium nitride layer 1342, and a P-type gallium nitride layer 1346 coupled to the second N-type gallium nitride layer 1344. The first N-type gallium nitride layer 1342 may serve as the N-region of the P-N diode and may have a relatively high N-type doping concentration. The second N-type gallium nitride layer 1344 may serve as a drift region and may have a relatively low doping concentration compared to that of the first N-type gallium nitride layer 1342. The P-type gallium nitride layer 1346 may serve as the P-region of the P-N diode and may have a relatively high P-type doping concentration.

In one embodiment, a portion of the second N-type gallium nitride layer 1344 and a portion of the P-type gallium nitride layer 1346 are removed to expose a portion of the first N-type gallium nitride layer 1342, so that a cathode contact 1370 may be formed thereon. In some embodiments, the cathode contact 1370 may comprise a titanium-aluminum (Ti/Al) alloy or other suitable metallic materials. The portion of the second N-type gallium nitride layer 1344 and the portion of the P-type gallium nitride layer 1346 may be removed by etching or other suitable techniques. An anode contact 1360 is formed on the remaining portion of the P-type gallium nitride layer 1346. In some embodiments, the anode 1360 may comprise a nickel-platinum (Ni/Pt) alloy, a nickel-gold (Ni/Au) alloy, or the like. The semiconductor diode 1300 may further include a first field plate 1382 coupled to the anode contact 1360, and a second field plate 1384 coupled to the cathode contact 1370. In some embodiments, the semiconductor diode 1300 may further include a passivation layer 1390 covering the exposed surfaces of the P-type gallium nitride layer 1346 and the first N-type gallium nitride layer 1342, and the second N-type gallium nitride layer 1344. The passivation layer 1390 may comprise silicon nitride or other insulating materials.

In some embodiments, the second N-type gallium nitride layer 1344 may have a thickness that is greater than about 20 µm. The unique CTE matching properties of the engineered substrate 1310 provide the ability to deposit a relatively thick drift region with low dislocation density may afford the semiconductor diode 1300 low leakage current and a much higher breakdown voltage, as well as many other advantages.

Figure 14:
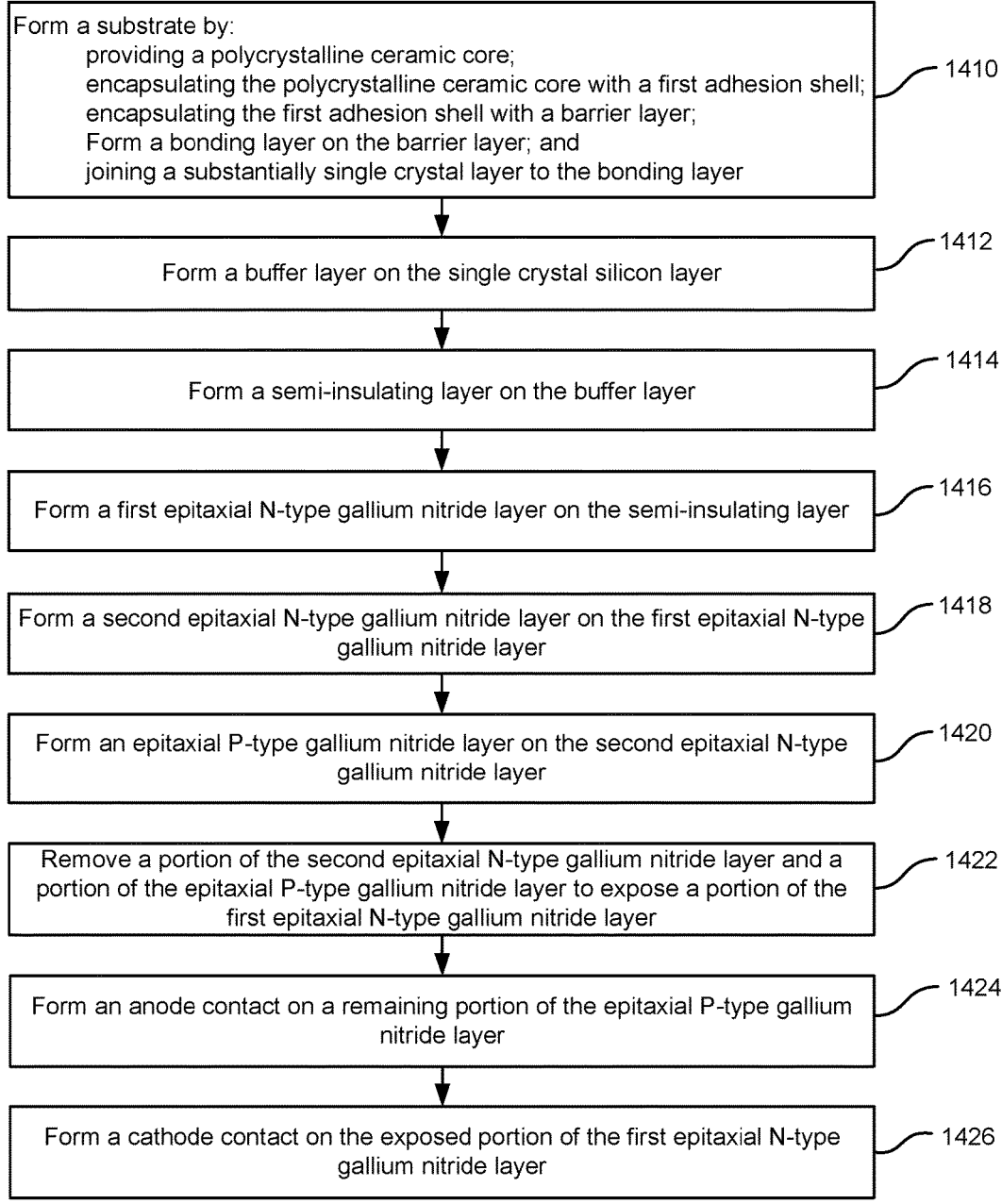
FIG. 14 is a simplified flowchart illustrating a method of fabricating a vertical semiconductor diode on an engineered substrate according to another embodiment of the present invention.

FIG. 14 is a simplified flowchart illustrating a method 1400 of fabricating a vertical semiconductor diode on an engineered substrate according to an embodiment of the present invention. The method 1400 includes, at 1410, forming a substrate by: providing a polycrystalline ceramic core, encapsulating the polycrystalline ceramic core with a first adhesion shell, encapsulating the first adhesion shell with a barrier layer, form a bonding layer on the barrier layer, and joining a substantially single crystal layer to the bonding layer.

The method 1400 further includes, at 1412, forming a buffer layer on the single crystal silicon layer; and at 1414, forming a semi-insulating layer on the buffer layer. The method 1400 further includes, at 1416, forming a first epitaxial N-type gallium nitride layer on the semi-insulating layer; at 1418, forming a second epitaxial N-type gallium nitride layer on the first epitaxial N-type gallium nitride layer; and at 1420 forming an epitaxial P-type gallium nitride layer on the second epitaxial N-type gallium nitride layer. According to some embodiments, the first N-type gallium nitride layer has a first doping concentration. The second epitaxial N-type gallium nitride layer has a second doping concentration less than the first doping concentration.

According to some embodiments, the method 1400 further includes, at 1422, removing a portion of the second epitaxial N-type gallium nitride layer and a portion of the epitaxial P-type gallium nitride layer to expose a portion of the first epitaxial N-type gallium nitride layer. The method 1400 further includes, at 1424, forming an anode contact on a remaining portion of the epitaxial P-type gallium nitride layer; and at 1426, forming a cathode contact on the exposed portion of the first epitaxial N-type gallium nitride layer.

It should be appreciated that the specific steps illustrated in FIG. 14 provide a particular method of fabricating an engineered substrate according to another embodiment of the present invention. Other sequences of steps may also be performed according to alternative embodiments. For example, alternative embodiments of the present invention may perform the steps outlined above in a different order. Moreover, the individual steps illustrated in FIG. 14 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 15:
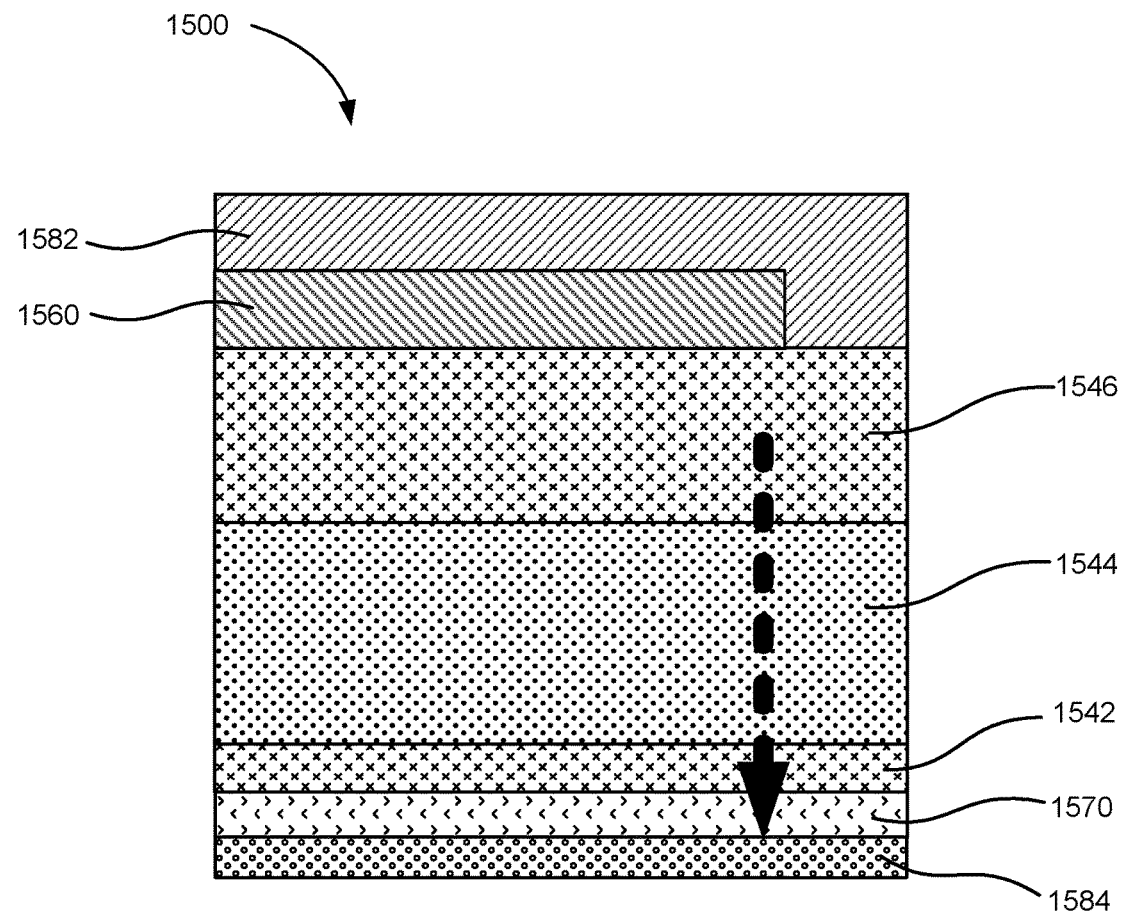
FIG. 15 is a simplified schematic cross-sectional diagram illustrating a vertical semiconductor diode formed on an engineered substrate according to another embodiment of the present invention.

FIG. 15 is a simplified schematic cross-sectional diagram illustrating a vertical semiconductor diode 1500 formed on an engineered substrate according to another embodiment of the present invention. The vertical semiconductor diode can include a first N-type gallium nitride layer 1542 coupled to a cathode contact 1570, which can include a Ti/Al material, a second N-type gallium nitride layer 1544 coupled to the first N-type gallium nitride layer 1542, and a P-type gallium nitride layer 1546 coupled to the second N-type gallium nitride layer 1544. The first N-type gallium nitride layer may serve as the N-region of the P-N diode and may have a relatively high N-type doping concentration. The second N-type gallium nitride layer 1544 may serve as a drift region and may have a relatively low doping concentration compared to that of the first N-type gallium nitride layer 1542. The P-type gallium nitride layer 1546 may serve as the P-region of the P-N diode and may have a relatively high P-type doping concentration. In some embodiments, the first N-type gallium nitride layer 1542, the P-type gallium nitride layer 1546, and the second N-type gallium nitride layer 1544 can be grown using epitaxial layers. The epitaxial layers can be grown on an engineered substrate as described above with reference to FIGS. 1, 3, and 4. The epitaxial layers can be at least 10 µm in thickness and 6 inches in diameter.

The vertical semiconductor diode 1500 is similar to the semiconductor diode 1300, except that the substrate 1310, the buffer layer 1320, and the semi-insulating layer 1330 are removed after the P-N diode has been formed, creating a "true" vertical device structure with anode 1560 and cathode 1584 on opposite sides of the wafer. In alternative embodiments, portions of the substrate 1310, the buffer layer 1320, and the semi-insulating layer 1330 to form a contact window. The contact window may be used to create the vertical device structure with anode 1560 and cathode 1584 on opposite sides of the wafer.

In some embodiments, the thermal resistance of the vertical semiconductor diode 1500 can be lowered by removing the engineered substrate 1310, the buffer layer 1320, and the semi-insulating layer 1330 from the structure illustrated in FIG. 13. In some embodiments, the vertical semiconductor diode 1500 may be transferred to copper, which can serve as a cathode electrical contact. Plated copper can also serve as a heatsink for the vertical semiconductor diode 1500. The copper can be 30 µm in thickness and the combination of the first N-type gallium nitride layer 1542, the second N-type gallium nitride layer 1544, and the P-type gallium nitride layer 1546 can be less than or equal to 150 µm in thickness. In this embodiment, the thermal resistance of the vertical semiconductor diode can be less than or equal to 0.2 K*mm$^2$/W. In this embodiment, the thermal resistance can be 4 times lower than a diode formed using epitaxial gallium nitride layers on a gallium nitride substrate.

In other embodiments, a deposited diamond layer can be formed to provide electrical connectivity to the first N-type gallium nitride layer 1542, to improve the thermal resistance, and/or provide a cathode electrical contact 1584. Chemical vapor deposition can be used to form the deposited diamond layer. The deposited diamond layer can be doped to form an N-type diamond layer. The deposited diamond layer can be a heatsink for a power device. In some embodiments, the deposited diamond layer can be 20 μm-50 μm in thickness. It should be appreciated that combinations of materials can be used to form the cathode electrical contact, including copper and a deposited diamond layer.

In some configurations, epitaxial layers adjacent to the substrate have a higher incidence of defects compared to epitaxial layers grown further from the interface with the substrate. The defects can include, for example, impurities, crystal mismatch, and dislocations. The defects in these initial layers can account for a high percentage of the device resistance. The unique CTE matching properties of the engineered substrate 1310 illustrated in FIG. 13 permit the first N-type gallium nitride layer 1542 adjacent to the engineered substrate 1310 to be thicker than epitaxial layers grown on a conventional substrate. In some embodiments, in addition to removing the engineered substrate 1310, layers of the first N-type gallium nitride layer 1542 adjacent to the engineered substrate 1310 can also be removed. In some embodiments, the cathode electrical contact 1584 can be formed directly on high quality gallium nitride epitaxial layers after the substrate and initial, higher defect, epitaxial layers have been removed.

Although removing the engineered substrate adds additional processing steps, it may ease metallization as the power-handling contacts are made on two different sides of the wafer, improving current spreading and heat extraction, and reducing electrical resistance. In some embodiments, to provide for a low electrical resistance the first N-type gallium nitride layer 1542 can have a dopant concentration at a level of $3\times10^{18}$ cm$^{-3}$ to $5\times10^{18}$ cm$^{-3}$. In some embodiments, the electrical resistance can be less than or equal to 0.1 Ohm*mm$^2$. Also, for the vertical semiconductor diode 1300 illustrated in FIG. 13, the anode contact 1360 may not be too close to the sidewall adjacent the cathode contact 1370, because otherwise there might be a breakdown between the anode contact 1360 and the cathode contact 1370. The vertical semiconductor diode 1500 eliminates this concern.

Figure 16:
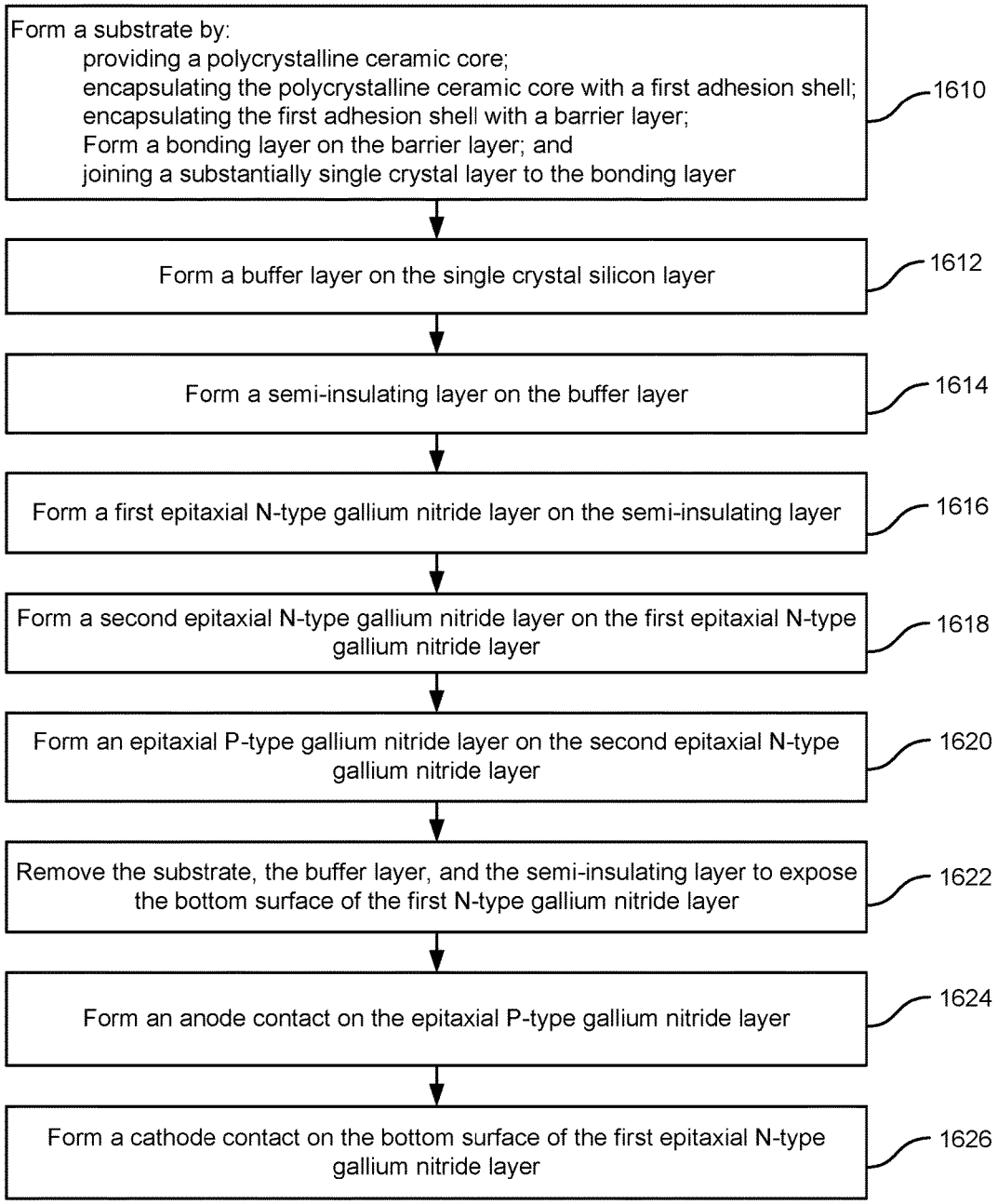
FIG. 16 is a simplified flowchart illustrating a method of fabricating a vertical semiconductor diode on an engineered substrate according to another embodiment of the present invention.

FIG. 16 is a simplified flowchart illustrating a method 1600 of fabricating a vertical semiconductor diode on an engineered substrate according to an embodiment of the present invention. The method 1600 includes, at 1610, forming a substrate by: providing a polycrystalline ceramic core, encapsulating the polycrystalline ceramic core with a first adhesion shell, encapsulating the first adhesion shell with a barrier layer, form a bonding layer on the barrier layer, and joining a substantially single crystal layer to the bonding layer.

The method 1600 further includes, at 1612, forming a buffer layer on the single crystal silicon layer; and at 1614, forming a semi-insulating layer on the buffer layer. The method 1600 further includes, at 1616, forming a first epitaxial N-type gallium nitride layer on the semi-insulating layer; at 1618, forming a second epitaxial N-type gallium nitride layer on the first epitaxial N-type gallium nitride layer; and at 1620 forming an epitaxial P-type gallium nitride layer on the second epitaxial N-type gallium nitride layer. According to some embodiments, the first N-type gallium nitride layer has a first doping concentration. The second epitaxial N-type gallium nitride layer has a second doping concentration less than the first doping concentration.

According to some embodiments, the method 1600 further includes, at 1622, removing the substrate, the buffer layer, and the semi-insulating layer to expose the bottom surface of the first N-type gallium nitride layer. In some embodiments, initial layers of the first N-type gallium nitride layer can be removed. Several techniques can be used to remove the engineered substrate, buffer layer, and the semi-insulating layer. For example, a chemical such as hydrofluoric acid (HF) can be infused into the lateral sides of the wafer retaining the vertical semiconductor diode to etch out one or more of the buffer layer and the semi-insulating layer while the ceramic core and vertical semiconductor diode epitaxial stack remain intact. Etching one or more of the buffer layer and the semi-insulating layer separates the vertical semiconductor diode epitaxial stack from the remainder of engineered substrate while preserving the ceramic core for reuse. This chemical lift off process also reduces overall stress on the vertical semiconductor diode epitaxial stack by eliminating polishing processes. If a gallium nitride substrate is used, the substrate cannot be selectively removed. Additionally, gallium nitride substrates include defects such as face flipping, residual stress, fragility, and miscut planes that affect the quality of the epitaxial layers grown thereon. In some embodiments using a gallium nitride substrate, 75% of the resistance can be attributed to defects in the substrate. Embodiments of the present invention which remove the substrate to expose epitaxial layers for contact formation can thereby reduce the electrical and thermal resistance.

In some embodiments, a sacrificial layer may be used for the chemical lift off process. The sacrificial layer may use a metal such as titanium (Ti) that is highly susceptible to dissolving when exposed to HF. In some embodiments, the sacrificial layer may comprise one of titanium (Ti), vanadium (V), chromium (Cr), tantalum (Ta), tungsten (W), rhenium (Re), silicon oxide, silicon nitride, silicon oxynitride, or a combination thereof. In addition to the sacrificial layer, a protective layer can be used. Protective layers may prevent diffusion of materials from sacrificial layer 200, such as Ti, into GaN epitaxial layers during epitaxial GaN growth. Additional description related to removing the substrate, the buffer layer, and the semi-insulating layer is provided in U.S. patent application Ser. No. 15/288,506, the disclosure of which is hereby incorporated by reference in its entirety for all purposes. The substrate removal process described in relation to the vertical semiconductor diode can be used for any of the devices described herein. One of ordinary skill in the art would recognize many variations, modifications, and alternatives.

The method further includes, at 1624, forming an anode contact on the epitaxial P-type gallium nitride layer; and at 1626, forming a cathode contact on the bottom surface of the first epitaxial N-type gallium nitride layer.

It should be appreciated that the specific steps illustrated in FIG. 16 provide a particular method of fabricating an engineered substrate according to another embodiment of the present invention. Other sequences of steps may also be performed according to alternative embodiments. For example, alternative embodiments of the present invention may perform the steps outlined above in a different order. Moreover, the individual steps illustrated in FIG. 16 may include multiple sub-steps that may be performed in various sequences as appropriate to the individual step. Furthermore, additional steps may be added or removed depending on the particular applications. One of ordinary skill in the art would recognize many variations, modifications, and alternatives.

Power devices may operate in harsh thermal conditions. For example, they may undergo thermal cycles up to several hundreds of degrees Celsius. Some local hot points could reach as high as 250° C. Thermal cycling and built-in stress may result in reliability failures, such as delamination, breakdown of dielectrics, and the like. Thus, forming GaN device layers on engineered substrates characterized by a CTE that is substantially matched to that of the power devices may eliminate or alleviate such reliability failures, because the GaN device layers may expand and shrink at the same rate as the engineered substrates do.

Figure 17:
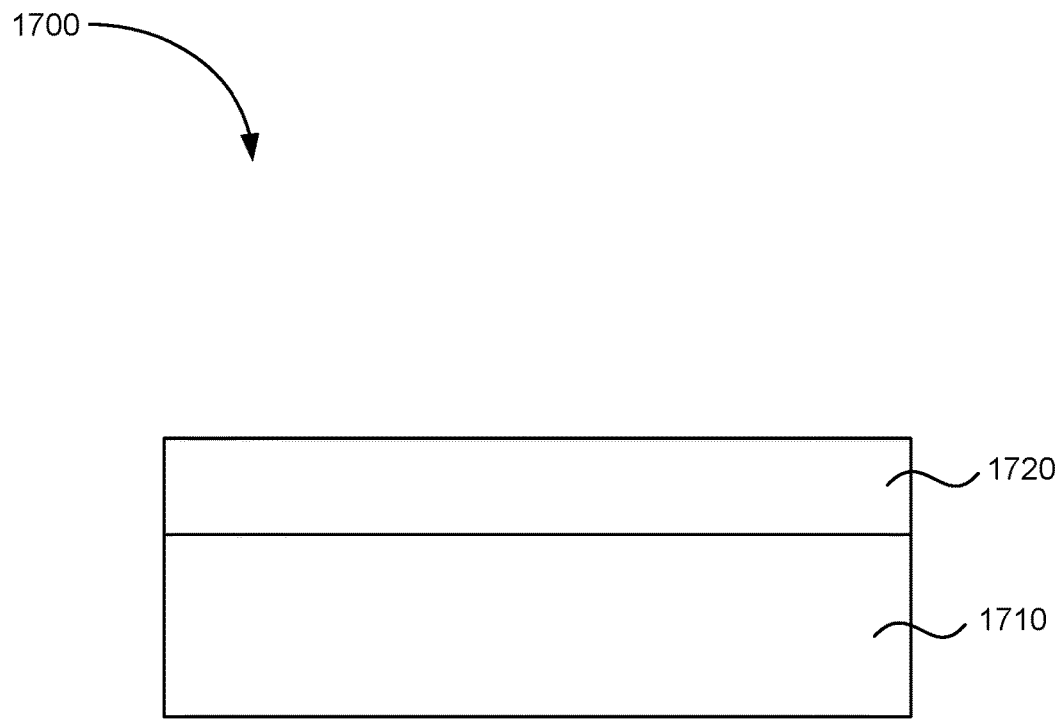
FIG. 17 is a simplified schematic cross-sectional diagram illustrating a semiconductor device formed on an engineered substrate according to an embodiment of the present invention.

FIG. 17 is a simplified schematic cross-sectional diagram illustrating a semiconductor device 1700 formed on an engineered substrate 1710 according to an embodiment of the present invention. The semiconductor device 1700 includes a substrate 1710. In some embodiments, as described above with references to FIGS. 1, 3, and 4, the engineered substrate 1710 may include a polycrystalline ceramic core, a first adhesion layer coupled to the polycrystalline ceramic core, a barrier layer coupled to the first adhesion layer, a bonding layer coupled to the barrier layer, and a substantially single crystal layer coupled to the bonding layer. According to an embodiment, the engineered substrate 1710 may further include a substantially single crystal layer coupled to the bonding layer. For example, the substantially single crystal layer may comprise substantially single crystalline silicon.

In one embodiment, the polycrystalline ceramic core of the substrate 1710 comprises aluminum nitride. In some embodiments, as discussed above with reference to FIG. 1, the substrate 1710 may further includes a conductive layer coupled to the first adhesion layer, and a second adhesion layer coupled to the conductive layer, wherein the conductive layer and the second adhesion layer are disposed between the first adhesion layer and the barrier layer. In some embodiments, the first adhesion layer may comprise a first tetraethyl orthosilicate (TEOS) oxide layer, and the second adhesion layer may comprise a second TEOS oxide layer. The barrier layer may comprise a silicon nitride layer. The conductive layer may comprise a polysilicon layer.

The semiconductor device 1700 includes a device structure 1720 formed on the engineered substrate 1710. According to some embodiments, the device structure 1720 may include a plurality of epitaxial gallium nitride based layers grown on the substantially single crystal layer of the substrate 1710, wherein the coefficient of thermal expansion of the plurality of epitaxial gallium nitride layers is substantially equal to a coefficient of thermal expansion of the substrate 1710.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A semiconductor diode comprising:
   a substrate comprising:
      a polycrystalline ceramic core;
      a first adhesion layer coupled to the polycrystalline ceramic core;
      a barrier layer coupled to the first adhesion layer;
      a bonding layer coupled to the barrier layer; and
      a substantially single crystal layer coupled to the bonding layer;
   a buffer layer coupled to the substantially single crystal layer;
   a semi-insulating layer coupled to the buffer layer;
   a first N-type gallium nitride layer coupled to the semi-insulating layer, the first N-type gallium nitride layer having a first doping concentration;
   a second N-type gallium nitride layer coupled to the first N-type gallium nitride layer, the second N-type gallium nitride layer having a second doping concentration less than the first doping concentration;
   a P-type gallium nitride layer coupled to the second N-type gallium nitride layer;
   an anode contact coupled to the P-type gallium nitride layer; and
   a cathode contact coupled to a portion of the first N-type gallium nitride layer.

2. The semiconductor diode of claim 1 wherein the buffer layer comprises:
   an aluminum nitride layer coupled to the substantially single crystal layer;
   an aluminum gallium nitride layer coupled to the aluminum nitride layer; and
   a gallium nitride layer coupled to the aluminum gallium nitride layer.

3. The semiconductor diode of claim 1 wherein the semi-insulating layer comprises gallium nitride.

4. The semiconductor diode of claim 1 wherein the substrate further comprises:
   a conductive layer coupled to the first adhesion layer; and
   a second adhesion layer coupled to the conductive layer, wherein the conductive layer and the second adhesion layer are disposed between the first adhesion layer and the barrier layer.

5. The semiconductor diode of claim 1 wherein the first N-type gallium nitride layer, the second N-type gallium nitride layer, and the P-type gallium nitride layer are formed by epitaxial growth.

6. The semiconductor diode of claim 5 wherein the second N-type gallium nitride layer has thickness that is greater than about 20 µm.

7. The semiconductor diode of claim 5 wherein the first N-type gallium nitride layer, the second N-type gallium nitride layer, and the P-type gallium nitride layer are characterized by a coefficient of thermal expansion (CTE) that is substantially equal to a CTE of the substrate.

* * * * *